(12) United States Patent
Uchida

(10) Patent No.: US 9,344,807 B2
(45) Date of Patent: May 17, 2016

(54) CAPACITANCE-TYPE TRANSDUCER, ACOUSTIC SENSOR, AND MICROPHONE

(71) Applicant: OMRON Corporation, Kyoto-shi, Kyoto (JP)

(72) Inventor: Yuki Uchida, Shiga (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 14/482,302

(22) Filed: Sep. 10, 2014

(65) Prior Publication Data

US 2015/0078589 A1 Mar. 19, 2015

(30) Foreign Application Priority Data

Sep. 13, 2013 (JP) .................. 2013-190630

(51) Int. Cl.
  *H04R 25/00* (2006.01)
  *H04R 19/00* (2006.01)
  *H04R 19/04* (2006.01)
  *H04R 31/00* (2006.01)
  *H04R 1/08* (2006.01)

(52) U.S. Cl.
  CPC .............. *H04R 19/005* (2013.01); *H04R 19/04* (2013.01); *H04R 31/00* (2013.01); *H04R 1/086* (2013.01)

(58) Field of Classification Search
  CPC . H04R 19/005; H04R 19/04; H04R 2201/003
  See application file for complete search history.

(56) References Cited

U.S. PATENT DOCUMENTS

| 6,741,709 | B2 * | 5/2004 | Kay ..................... | H04R 19/005 381/174 |
| 8,327,711 | B2 * | 12/2012 | Kasai .................. | H04R 19/005 73/649 |
| 8,987,842 | B2 * | 3/2015 | Hsieh ................... | B81B 3/00 257/415 |
| 2007/0201709 | A1 * | 8/2007 | Suzuki ................. | B81B 3/0072 381/174 |
| 2010/0002895 | A1 * | 1/2010 | Notake ................ | B81B 3/0051 381/174 |
| 2010/0176821 | A1 * | 7/2010 | Kasai .................... | H04R 19/04 324/660 |
| 2011/0075866 | A1 | 3/2011 | Zhang | |

FOREIGN PATENT DOCUMENTS

JP 2011-239324 A 11/2011

* cited by examiner

*Primary Examiner* — Curtis Kuntz
*Assistant Examiner* — Ryan Robinson
(74) *Attorney, Agent, or Firm* — Osha Liang LLP

(57) ABSTRACT

A capacitance-type transducer has a substrate having a cavity, a vibrating electrode plate disposed above the substrate, a back plate disposed on the substrate, a fixed electrode plate disposed on the back plate opposite the vibrating electrode plate, a plurality of holes formed in the back plate and the fixed electrode plate, and a protrusion disposed on the back plate at a location opposing the vibrating electrode plate. In a view from a direction perpendicular to an upper surface of the substrate, a shortest distance from a cross-sectional center of the protrusion to an edge of a hole adjacent to the protrusion is larger than a shortest distance from a center of a region that is surrounded by the holes but not provided with the protrusion to an edge of a hole in the periphery.

14 Claims, 21 Drawing Sheets

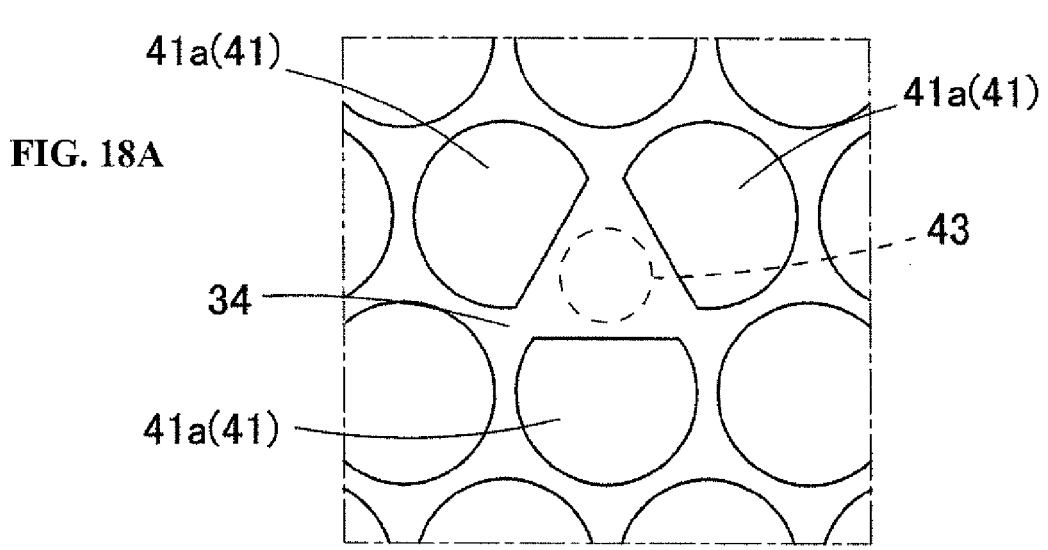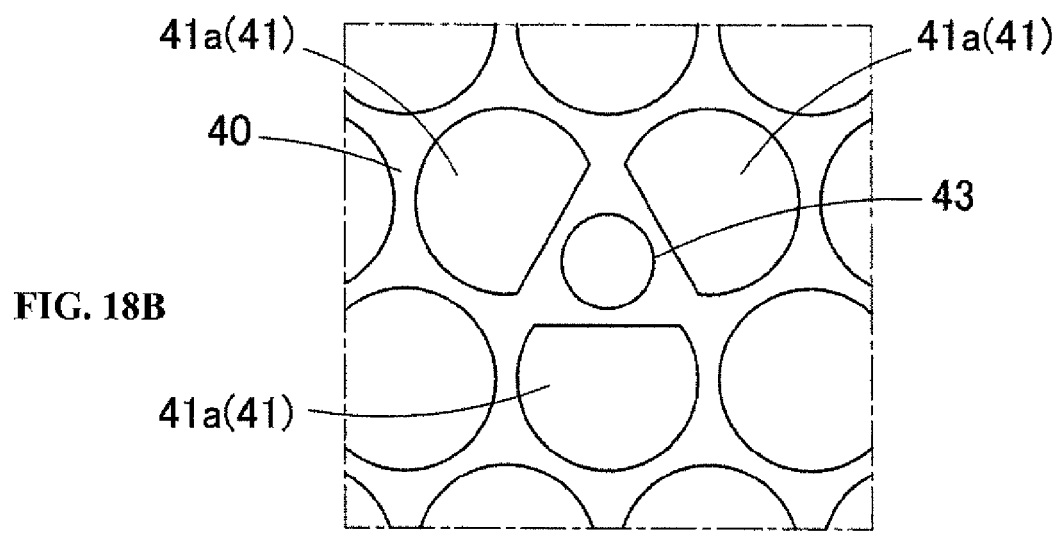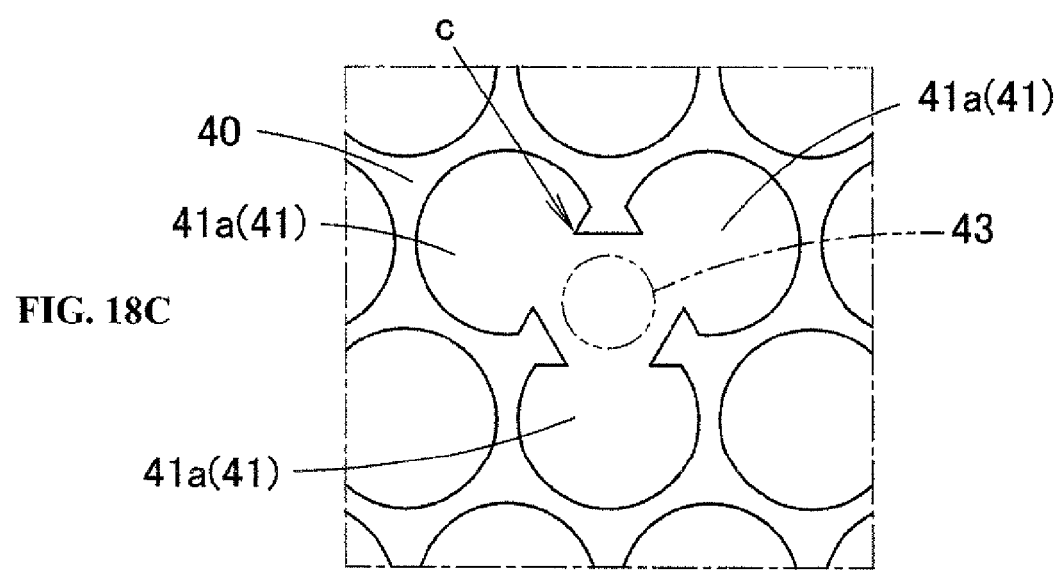

CAPACITANCE-TYPE TRANSDUCER, ACOUSTIC SENSOR, AND MICROPHONE

BACKGROUND

1. Field

The present invention relates to a capacitance-type transducer, an acoustic sensor, and a microphone. Specifically, the present invention relates to a capacitance-type transducer configured by a capacitor structure made up of a vibrating electrode plate (diaphragm) and a fixed electrode plate. Also, the present invention relates to an acoustic sensor (acoustic transducer) that converts acoustic vibration into an electrical signal and outputs the electrical signal, and a microphone that employs this acoustic sensor. In particular, the present invention relates to a small-size capacitance-type transducer and acoustic sensor manufactured using MEMS (Micro Electro Mechanical System) technology.

2. Related Art

FIG. 1 is a cross-sectional diagram showing an example of a conventional capacitance type of acoustic sensor manufactured using MEMS technology. In an acoustic sensor 11 shown here, a cavity 13 is formed in a substrate 12, and a diaphragm 14 (vibrating electrode plate) is provided above the substrate 12 so as to cover the upper opening of the cavity 13. If the diaphragm 14 is rectangular, for example, the four corner portions thereof are supported on the upper surface of the substrate 12 by anchors 15. A dome-shaped back plate 16 is formed on the upper surface of the substrate 12, and the back plate 16 covers the diaphragm 14. A fixed electrode plate 17 is provided on the lower surface of the back plate 16, and the fixed electrode plate 17 opposes the diaphragm 14. The diaphragm 14 and the fixed electrode plate 17 oppose each other, thus configuring a variable capacitor for converting acoustic vibration into an electrical signal. Also, a large number of circular acoustic holes 18 are formed in the back plate 16 and the fixed electrode plate 17. Multiple stoppers 19 are provided on the lower surface of the back plate 16 so as to project from the fixed electrode plate 17. This type of acoustic sensor is disclosed in JP 2011-239324, for example.

The acoustic holes 18 are holes serving as passes for acoustic vibration. For example, acoustic vibration that has entered the acoustic sensor 11 through the acoustic holes 18 causes the diaphragm 14 to vibrate, and then moves to the cavity 13. Alternatively, acoustic vibration that has entered the acoustic sensor 11 through the cavity 13 causes the diaphragm 14 to vibrate, and then moves to the outside through the acoustic holes 18. Also, the stoppers 19 are provided in order to prevent the diaphragm 14 from sticking (adhering) to and not separating from the fixed electrode plate 17. If the stoppers 19 are not provided, there are cases where electrostatic attraction force is generated between the diaphragm 14 and the fixed electrode plate 17 due to the bias voltage applied between the diaphragm 14 and the fixed electrode plate 17, and the diaphragm 14 adheres to and does not separate from the fixed electrode plate 17 due to the electrostatic attraction force. There are also cases where the diaphragm 14 adheres to and does not separate from the fixed electrode plate 17 due to the surface tension of moisture remaining in the air gap between the diaphragm 14 and the fixed electrode plate 17. The stoppers 19 are for preventing the diaphragm 14 from sticking to the fixed electrode plate 17 by coming into contact with the diaphragm 14 before the fixed electrode plate 17 in such cases.

These capacitance type of acoustic sensors may have a reduction in the S/N ratio caused by thermal noise in the air gap. Thermal noise in the air gap is noise generated due to air molecules in the air gap between the diaphragm and the fixed electrode plate (i.e., in a semi-airtight space) colliding with the diaphragm due to fluctuating (thermal motion). The very small force received by the diaphragm due to the colliding air molecules changes randomly due to the fluctuation of the air molecules, and therefore the diaphragm vibrates irregularly due to the colliding air molecules, and electrical noise caused by thermal noise is generated in the acoustic sensor. In high-sensitivity acoustic sensors in particular, this noise caused by thermal noise is large, and the S/N ratio becomes worse.

This noise caused by thermal noise can be reduced by increasing the opening ratio of the acoustic holes formed in the back plate and the fixed electrode plate so as to make it easier for air in the air gap to pass through the acoustic holes. Accordingly, in order to improve the S/N ratio in the above-described acoustic sensor 11 as well, the opening area (opening ratio) of the acoustic holes 18 needs to be increased.

On the other hand, if the diameter (or cross-sectional area) of the stoppers 19 is too small, there are cases where the diaphragm 14 and the stoppers 19 collide due to impact when the acoustic sensor 11 is dropped, and the diaphragm 14 is damaged by the tips of the stoppers 19. The stoppers 19 therefore need to have a certain thickness (or cross-sectional area).

However, if the opening area of the acoustic holes 18 is increased in order to improve the S/N ratio, the area of the region surrounded by the acoustic holes 18 in the back plate 16 decreases, thus making it impossible to provide large-diameter stoppers 19. The diameter of the stoppers 19 therefore needs to be reduced, and the diaphragm 14 is more easily damaged by collision with the stoppers 19 when the acoustic sensor 11 is subjected to drop impact as described above, for example.

Also, since the acoustic holes 18 cannot be provided so as to be overlapped with the positions where the stoppers 19 are located, if the diameter of the stoppers 19 is increased, the opening area of the acoustic holes 18 can no longer be increased, and the S/N ratio of the acoustic sensor 11 decreases.

Accordingly, in conventional acoustic sensors, there is a trade-off relationship between increasing the opening area (opening ratio) of the acoustic holes in order to improve the S/N ratio and increasing the diameter (cross-sectional area) of the stoppers in order to prevent damage to the diaphragm.

Note that with the back plate disclosed in FIG. 3 of U.S. patent application No. 2011/0075866, a large region (region without acoustic holes) that is larger than the other regions is provided in a portion of the back plate. However, there is no recitation of providing stoppers in this wide region in U.S. patent application No. 2011/0075866. Also, the total opening area of the acoustic holes would decrease with such a structure.

JP 2011-239324A and the description of U.S. patent application No. 2011/0075866 (FIG. 3) are examples of background art.

SUMMARY

One or more embodiments of the present invention provides a capacitance-type transducer, an acoustic sensor, and the like in which the S/N ratio can be improved by increasing the opening area of the acoustic holes, and durability when the vibrating electrode plate (diaphragm) is subjected to drop impact and the like can be improved.

A capacitance-type transducer according to one or more embodiments of the present invention includes: a substrate having a cavity; a vibrating electrode plate provided above the substrate; a back plate provided on the substrate; a fixed electrode plate provided on the back plate in opposition to the vibrating electrode plate; a plurality of holes provided in the back plate and the fixed electrode plate; and a protrusion provided on the back plate at a location opposing the vibrating electrode plate, wherein in a view from a direction perpendicular to an upper surface of the substrate, a shortest distance from a cross-sectional center of the protrusion to an edge of a hole adjacent to the protrusion is larger than a shortest distance from a center of a region that is surrounded by the holes but not provided with the protrusion to an edge of a hole in the periphery.

According to a capacitance-type transducer of one or more embodiments of the present invention, in a view from the direction perpendicular to the upper surface of the substrate, the shortest distance from the cross-sectional center of the protrusion to the edge of a hole adjacent to the protrusion is larger than the shortest distance from the center of the region that is surrounded by the holes but not provided with the protrusion to the edge of a hole in the periphery, thus making it possible to increase the area of the region provided with the protrusion without reducing the number of holes. As a result, it is possible to increase the cross-sectional area of the protrusion while substantially maintaining the total opening area of the holes. This makes it possible to improve durability when the vibrating electrode plate is subjected to drop impact or the like, while maintaining the S/N ratio of the capacitance-type transducer.

In a capacitance-type transducer according to one or more embodiments of the present invention, the holes are arranged regularly with a region having a constant area serving as a unit, and among the regions having a constant area, the total area of the holes included in a region that has the protrusion is smaller than the total area of the holes included in a region that does not have the protrusion. Accordingly, the total area of the holes in the region having the protrusion is reduced, thus making it possible to increase the area of the region provided with the protrusion by a commensurate amount. On the other hand, the opening area of the holes is reduced only in the periphery of the protrusion, and the overall reduction in the total opening area of the holes is small. Accordingly, the cross-sectional area of the protrusion can be increased while substantially maintaining the total opening area of the holes.

In a capacitance-type transducer according to one or more embodiments of the present invention, the number of holes included in a region that encloses the holes adjacent to the protrusion is the same as the number of holes included in a region that encloses the holes adjacent to a center of a region that is surrounded by the holes but not provided with the protrusion. Accordingly, the area of the region provided with the protrusion can be increased without reducing the number of holes, thus making it possible to increase the cross-sectional area of the protrusion while substantially maintaining the total opening area of the holes.

A capacitance-type transducer according to one or more embodiments of the present invention includes: a substrate having a cavity; a vibrating electrode plate provided above the substrate; a back plate provided on the substrate; a fixed electrode plate provided on the back plate in opposition to the vibrating electrode plate; a plurality of holes provided in the back plate and the fixed electrode plate; and a protrusion provided on the back plate at a location opposing the vibrating electrode plate, wherein the area of at least one hole among the holes adjacent to the protrusion is smaller than the area of a hole not adjacent to the protrusion.

According to a capacitance-type transducer of one or more embodiments of the present invention, the area of at least one of the holes adjacent to the protrusion is reduced, thus making it possible to increase the area of the region for providing the protrusion, and to increase the cross-sectional area of the protrusion. Moreover, since the opening area of the holes is reduced only in the periphery of the protrusion, the cross-sectional area of the protrusion can be increased while substantially maintaining the total opening area of the holes. In a capacitance-type transducer according to one or more embodiments of the present invention, the holes adjacent to the protrusion and the other holes may have similar shapes, for example.

A capacitance-type transducer according to one or more embodiments of the present invention includes: a substrate having a cavity; a vibrating electrode plate provided above the substrate; a back plate provided on the substrate; a fixed electrode plate provided on the back plate in opposition to the vibrating electrode plate; a plurality of holes provided in the back plate and the fixed electrode plate; and a protrusion provided on the back plate at a location opposing the vibrating electrode plate, wherein in an edge of at least one hole among the holes adjacent to the protrusion, a portion of the edge in the vicinity of the protrusion is drawn toward the interior of the hole in comparison with another hole.

According to a capacitance-type transducer of one or more embodiments of the present invention, the edge of at least one of the holes adjacent to the protrusion is drawn inward, thus making it possible to increase the area of the region for providing the protrusion, and to increase the cross-sectional area of the protrusion. Moreover, since the opening area of the holes is reduced only in the periphery of the protrusion, the cross-sectional area of the protrusion can be increased while substantially maintaining the total opening area of the holes. In a capacitance-type transducer according to one or more embodiments of the present invention, the holes other than the holes adjacent to the protrusion may have shapes that are the same as or similar to each other, and the at least one hole among the holes adjacent to the protrusion and the other holes may not have the same shape, and may not have similar shapes either, for example.

A capacitance-type transducer according to one or more embodiments of the present invention includes: a substrate having a cavity; a vibrating electrode plate provided above the substrate; a back plate provided on the substrate; a fixed electrode plate provided on the back plate in opposition to the vibrating electrode plate; a plurality of holes provided in the back plate and the fixed electrode plate; and a protrusion provided on the back plate at a location opposing the vibrating electrode plate, wherein a space between holes adjacent to the protrusion is larger than a space between holes not adjacent to the protrusion.

According to a capacitance-type transducer of one or more embodiments of the present invention, the space between holes adjacent to the protrusion is increased, thus making it possible to increase the area of the region for providing the protrusion, and to increase the cross-sectional area of the protrusion. Moreover, since the opening area of the holes can be maintained, it is possible to improve durability when the vibrating electrode plate is subjected to drop impact or the like, without reducing the S/N ratio. In a capacitance-type transducer according to one or more embodiments of the present invention, the holes other than the holes adjacent to the protrusion may be in a regular arrangement with a constant pitch, and positions of the holes adjacent to the protrusion may be shifted in a direction of separation from the protrusion relative to regular positions of the holes, for example.

A capacitance-type transducer according to one or more embodiments of the present invention includes: a substrate having a cavity; a vibrating electrode plate provided above the substrate; a back plate provided on the substrate; a fixed electrode plate provided on the back plate in opposition to the vibrating electrode plate; a plurality of holes provided in the back plate and the fixed electrode plate; and a protrusion provided on the back plate at a location opposing the vibrating electrode plate, wherein at least one hole among the holes adjacent to the protrusion has a flattened opening shape, and a minor axis direction of the hole having the flattened opening shape is oriented in a direction connecting a center of the hole and a cross-sectional center of the protrusion.

According to a capacitance-type transducer of one or more embodiments of the present invention, it is possible to increase the area of the region for providing the protrusion, and to increase the cross-sectional area of the protrusion. Moreover, since the opening area of the holes can be maintained, it is possible to improve durability when the vibrating electrode plate is subjected to drop impact or the like, without reducing the S/N ratio.

In a capacitance-type transducer according to one or more embodiments of the present invention, edges of the holes adjacent to the protrusion and an edge of the protrusion are separated from each other. Accordingly, a decrease in the strength of the back plate can be prevented.

In a capacitance-type transducers according to one or more embodiments of the present invention, the area of a region enclosed by the holes adjacent to the protrusion is larger than the cross-sectional area of the protrusion. Accordingly, a decrease in the strength of the back plate can be prevented.

In a capacitance-type transducers according to one or more embodiments of the present invention, protrusions are arranged such that there is no overlap between the holes adjacent to one protrusion and the holes adjacent to another protrusion. This is because the opening area of the holes decreases if there is overlap between the holes adjacent to one protrusion and the holes adjacent to another protrusion.

A capacitance-type transducer according to one or more embodiments of the present invention can also be used as an acoustic sensor. A capacitance-type transducer according to the present invention can also be used as a microphone in which the acoustic sensor is combined with a circuit portion.

A scope of the present invention includes combinations of the above-described constituent elements, and many variations to the disclosed embodiments are possible according to the combination of the constituent elements.

BRIEF DESCRIPTION OF THE DRAWINGS

FIGS. 18A, 18B, and 18C are diagrams for describing yet another point to consider in design.

FIG. 21 is a cross-sectional diagram of a microphone with an acoustic sensor according to one or more embodiments of the present invention built in.

DETAILED DESCRIPTION

Embodiments of the present invention are described below with reference to the accompanying drawings. Note that the present invention is not limited to the following embodiments, and various design modifications can be made within the scope of the present invention. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Embodiment 1

Figure 1:
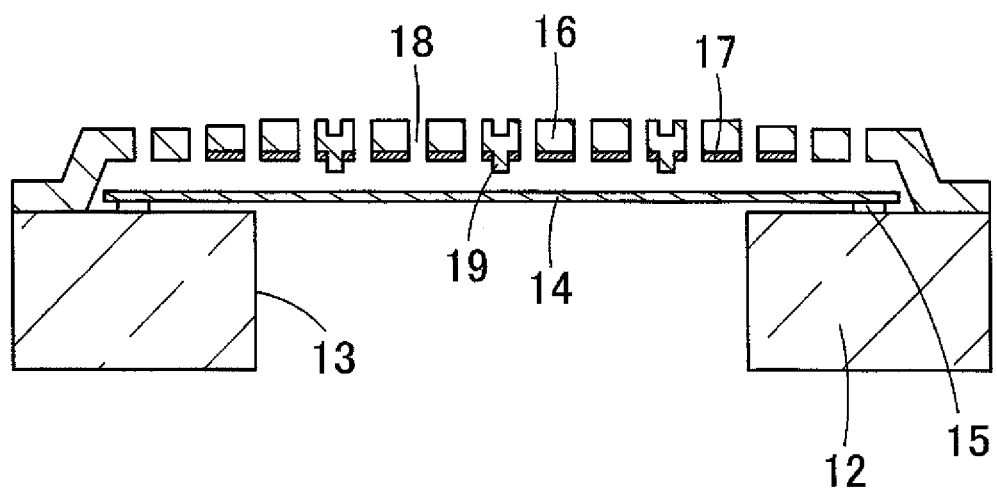
FIG. 1 is a cross-sectional diagram showing an example of a conventional capacitance type of acoustic sensor.
Figure 2:
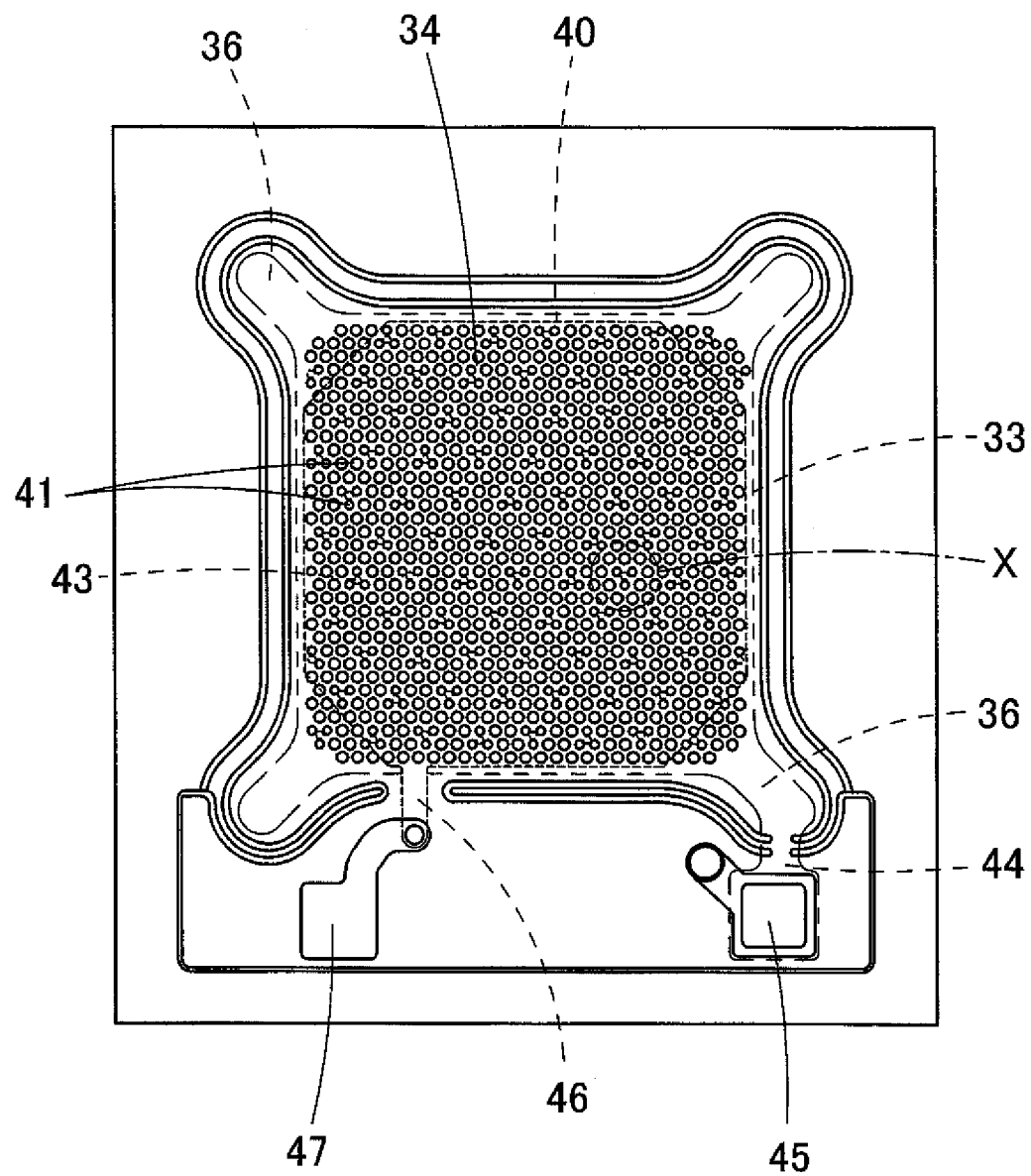
FIG. 2 is a plan view of an acoustic sensor according to Embodiment 1 of the present invention.
Figure 3:
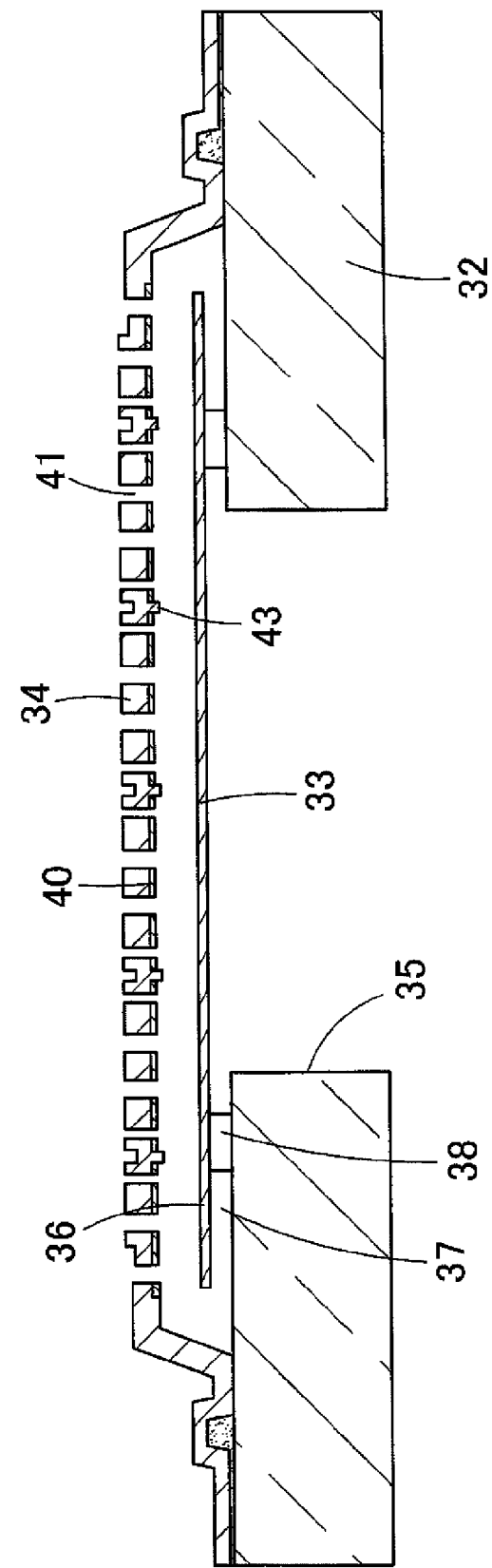
FIG. 3 is a cross-sectional diagram of the acoustic sensor shown in FIG. 2.
Figure 4:
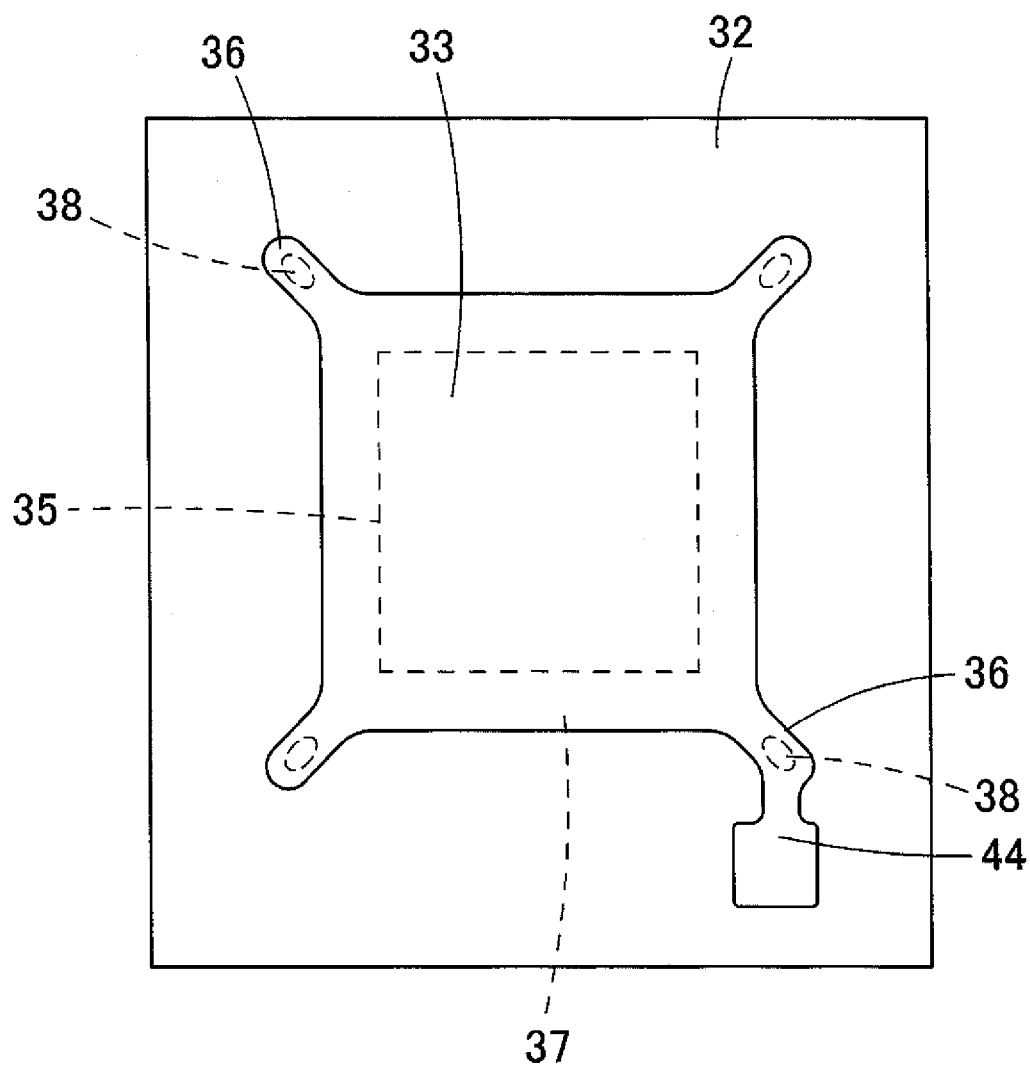
FIG. 4 is a plan view of a diaphragm provided on the upper surface of a substrate in the acoustic sensor shown in FIG. 2.
Figure 5:
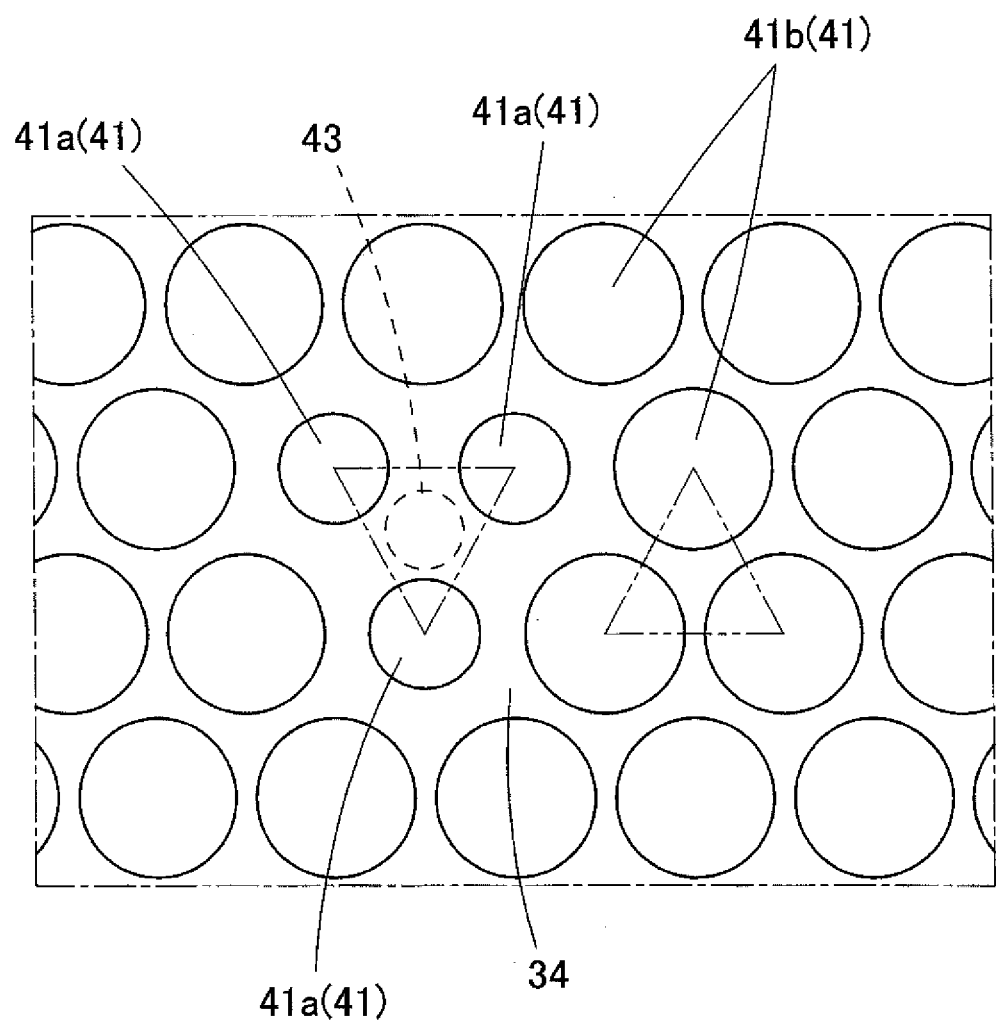
FIG. 5 is an enlarged view of a portion X in FIG. 2.

The structure of an acoustic sensor 31 according to Embodiment 1 of the present invention will be described below with reference to FIGS. 2 to 5. FIG. 2 is a plan view of the acoustic sensor 31 according to Embodiment 1 of the present invention. FIG. 3 is a cross-sectional diagram of the acoustic sensor 31. FIG. 4 is a plan view showing the shape of a diaphragm 33 (vibrating electrode plate) formed on the upper surface of a substrate 32. FIG. 5 is an enlarged view of a portion X in FIG. 2.

The acoustic sensor 31 is a capacitance-type sensor created using MEMS technology. As shown in FIG. 3, in the acoustic sensor 31, a vibrating electrode plate (i.e., a diaphragm) 33 is formed on the upper surface of the substrate 32, which is a silicon substrate or the like, and a back plate 34 is provided above the diaphragm 33 via a very small air gap.

A cavity 35 is formed in the substrate 32 so as to pass from the upper surface to the lower surface. The cavity 35 serves as the back chamber or the front chamber depending on the use mode of the acoustic sensor 31. The wall surfaces of the cavity 35 may be surfaces perpendicular to the upper surface of the substrate 32, or may be inclined with respect to the upper surface of the substrate 32.

The diaphragm 33 is formed by a conductive polysilicon thin film. As shown in FIG. 4, the diaphragm 33 is formed in a substantially rectangular shape, and leg pieces 36 extend horizontally in respective diagonal directions from the corners. The diaphragm 33 is arranged on the upper surface of the substrate 32 so as to cover the upper opening of the cavity 35, and the lower surfaces of the leg pieces 36 are supported by anchors 38. The diaphragm 33 is therefore arranged on the upper surface of the substrate 32 so as to float above the upper surface of the substrate 32.

As shown in FIG. 3, a gap that is narrow in the height direction for allowing the passage of acoustic vibration or air, that is to say a vent hole 37, is formed between the lower surface of the diaphragm 33 and the upper surface of the substrate 32 in the periphery of the cavity 35. The vent hole 37 is formed along the portion between adjacent leg pieces 36 where the diaphragm 33 opposes the upper surface of the substrate 32.

A back plate 34 made of SiN is provided on the upper surface of the substrate 32. The back plate 34 is shaped as a substantially rectangular dome, and the diaphragm 33 is covered by the cavity portion. A fixed electrode plate 40 made of polysilicon is provided on the lower surface of the back plate 34 so as to oppose the diaphragm 33.

A very small air gap is formed between the lower surface of the fixed electrode plate 40 and the upper surface of the diaphragm 33. The fixed electrode plate 40 and the diaphragm 33 oppose each other so as to configure a variable capacitor for detecting and converting acoustic vibration into an electrical signal.

A large number of holes that pass from the upper surface to the lower surface, that is to say acoustic holes 41 for allowing the passage of acoustic vibration, are formed in substantially the entirety of the back plate 34 and the fixed electrode plate 40. As shown in FIGS. 2 and 5, the acoustic holes 41 are in a regular arrangement. The acoustic holes 41 are arranged in a triangular shape along three directions that form 120° or 60° angles with each other in the illustrated example, and the centers of the acoustic holes 41 are aligned regularly with a constant pitch.

As shown in FIG. 3, a large number of very small cylindrical protrusions, that is to say stoppers 43, are provided on the lower surface of the back plate 34, and the stoppers 43 pass through the fixed electrode plate 40 and protrude downward. The stoppers 43 are formed from SiN likewise to the back plate 34, and are insulating. The stoppers 43 are provided in order to prevent the diaphragm 33 from adhering to the fixed electrode plate 40, and pass through the fixed electrode plate 40 and protrude from the lower surface of the back plate 34.

Also, as shown in FIG. 2, a lead 44 extends from one of the leg pieces 36 of the diaphragm 33, and the lead 44 is electrically connected to electrode pad 45. Similarly, a lead 46 extends from the fixed electrode plate 40, and the lead 46 is electrically connected to an electrode pad 47.

In the acoustic sensor 31 having the above-described structure, the capacitance between the diaphragm 33 and the fixed electrode plate 40 changes when the diaphragm 33 vibrates due to acoustic vibration, and thus the acoustic vibration is converted into an electrical signal that is then output.

Also, a feature of the acoustic sensor 31 lies in the arrangement of the acoustic holes 41. As shown in FIG. 5, in the acoustic sensor 31, the acoustic holes 41 are in a regular arrangement, and the opening area of the acoustic holes 41 adjacent to a stopper 43 (hereinafter, the acoustic holes 41 adjacent to a stopper 43 are indicated by the reference sign 41a) is smaller than the opening area of the acoustic holes 41 not adjacent to a stopper 43 (hereinafter, the acoustic holes 41 not adjacent to a stopper 43 are indicated by the reference sign 41b). In other words, the opening area of the acoustic holes 41a that surround a stopper 43 is smaller than the opening area of the other acoustic holes 41b. In a typical example, the acoustic holes 41a have a smaller opening area while having a shape similar to the acoustic holes 41b as shown in the figure.

According to this acoustic hole arrangement, at a location where a stopper 43 is provided, the area of the region surrounded by the acoustic holes 41a is larger, and therefore a stopper 43 having a large cross-sectional area can be provided, thus making it less likely for the diaphragm 33 to be damaged by the tip of the stopper 43 in the case of drop impact or the like (note that there is the risk of the diaphragm 33 sticking to the stopper 43 if the cross-sectional area of the stopper 43 is too large, and therefore an optimal cross-sectional area needs to be selected). Moreover, in the acoustic sensor 31, the opening area of only the acoustic holes 41a that surround a stopper 43 is smaller, and therefore compared to the case where the opening area of all of the acoustic holes is reduced to accommodate stoppers 43 having a large cross-sectional area, the total opening area of the acoustic holes 41a and 41b can be increased, and the S/N ratio of the acoustic sensor 31 can be improved. Also, even in comparison with the case where all of the acoustic holes have the same size as the acoustic holes 41b (stoppers 43 having a large cross-sectional area cannot be provided in this case), there is no decrease in the number of acoustic holes, and merely the opening area of some of the acoustic holes (41a) is smaller, and therefore the degradation of the S/N ratio is also low. Accordingly, the acoustic sensor 31 of Embodiment 1 makes it possible to improve the S/N ratio and also improve the durability of the diaphragm.

The acoustic hole arrangement in the acoustic sensor 31 having the above-described superior effects is characterized by the following configuration.

Firstly, the acoustic holes in Embodiment 1 are in a regular arrangement with the triangular region indicated by dashed double-dotted lines in FIG. 5 serving as the repeating smallest unit. Among the repeating smallest units having a constant area, the total area of the acoustic holes 41a included in a repeating smallest unit having a stopper 43 is smaller than the total area of the acoustic holes 41b included in a repeating smallest unit not having a stopper 43, Accordingly, at the locations where the stoppers 43 are provided, the area of the region surrounded by the acoustic holes 41a is larger.

In the acoustic sensor 31 of Embodiment 1, a shortest distance D (shown in FIG. 6A) from a cross-sectional center P of a stopper 43 to the edge of an acoustic hole 41a adjacent to the stopper 43 is longer than a shortest distance d (shown in FIG. 6B) in a region in which the stopper 43 is not provided, this shortest distance d being from the point that corresponds to the cross-sectional center of the stopper (i.e., a center Q of the region that is surrounded by the holes but is not provided with the protrusion) to the edge of an acoustic hole 41b in the periphery.

Figure 6A:
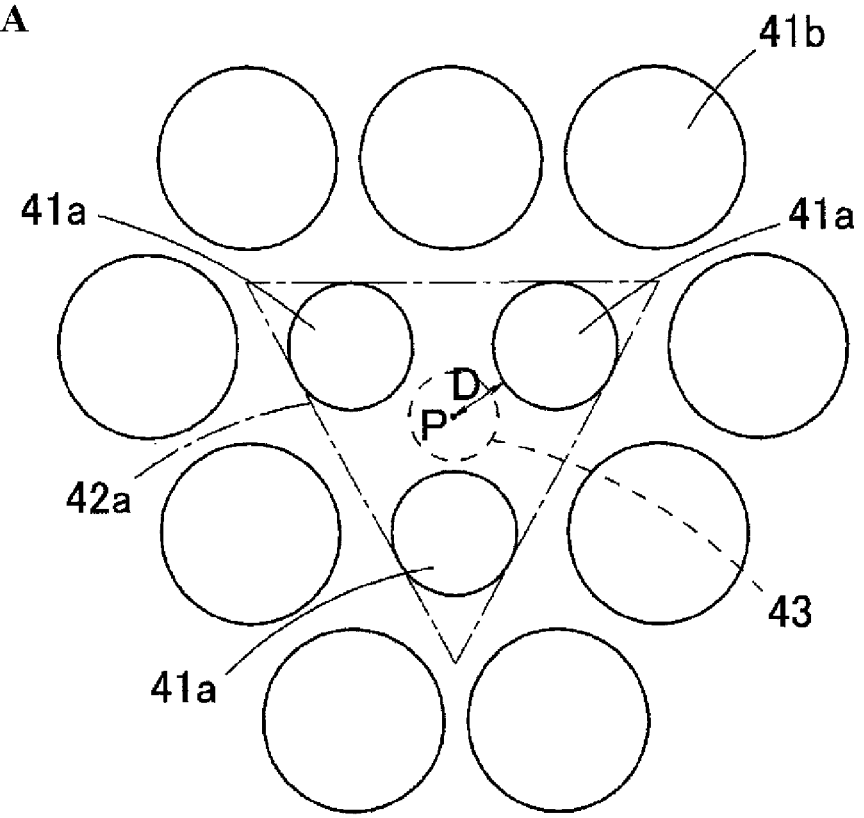
FIGS. 6A and 6B are diagrams for describing features of the arrangement of acoustic holes in the acoustic sensor according to Embodiment 1 of the present invention.
Figure 6B:
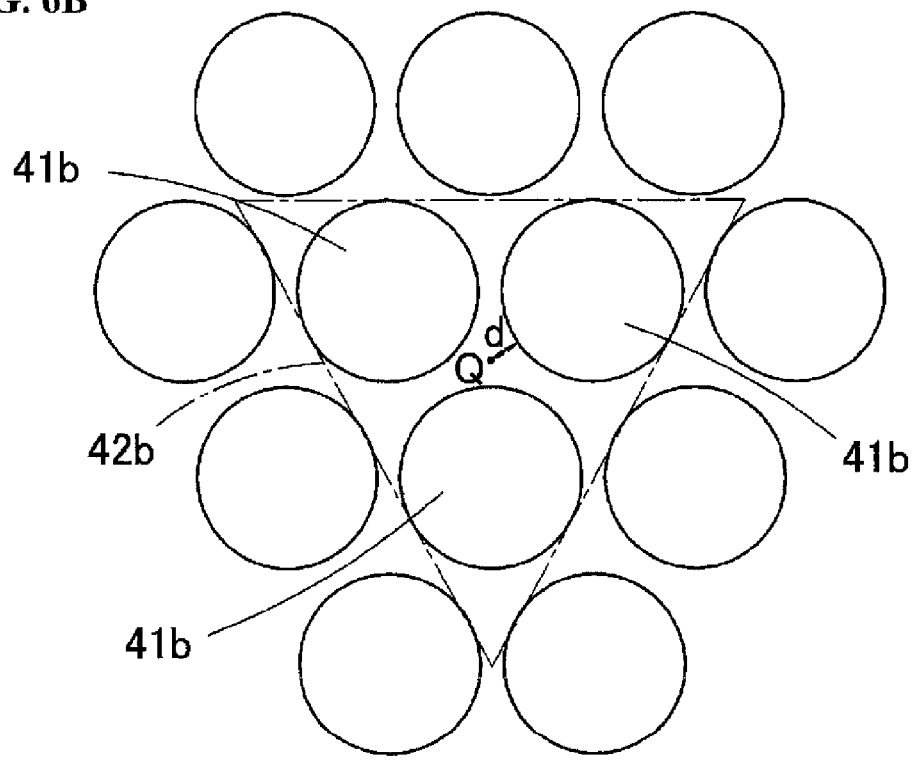

Also, in the acoustic sensor 31 of Embodiment 1, consider a frame 42a that encloses the acoustic holes 41a adjacent to the stopper 43 as shown in FIG. 6A, and a frame 42b that encloses the acoustic holes 41b adjacent to the point Q in the region in which a stopper 43 is not provided as shown in FIG. 6B. In Embodiment 1, the number of acoustic holes 41a included in the region enclosed by the frame 42a is the same as the number of acoustic holes 41b included in the region enclosed by the frame 42b.

Since Embodiment 1 has the above-described features, the SN ratio can be improved, or a decrease in the S/N ratio can be suppressed to a minimum, and stoppers 43 having a large cross-sectional area can be provided.

Embodiment 2

Figure 7:
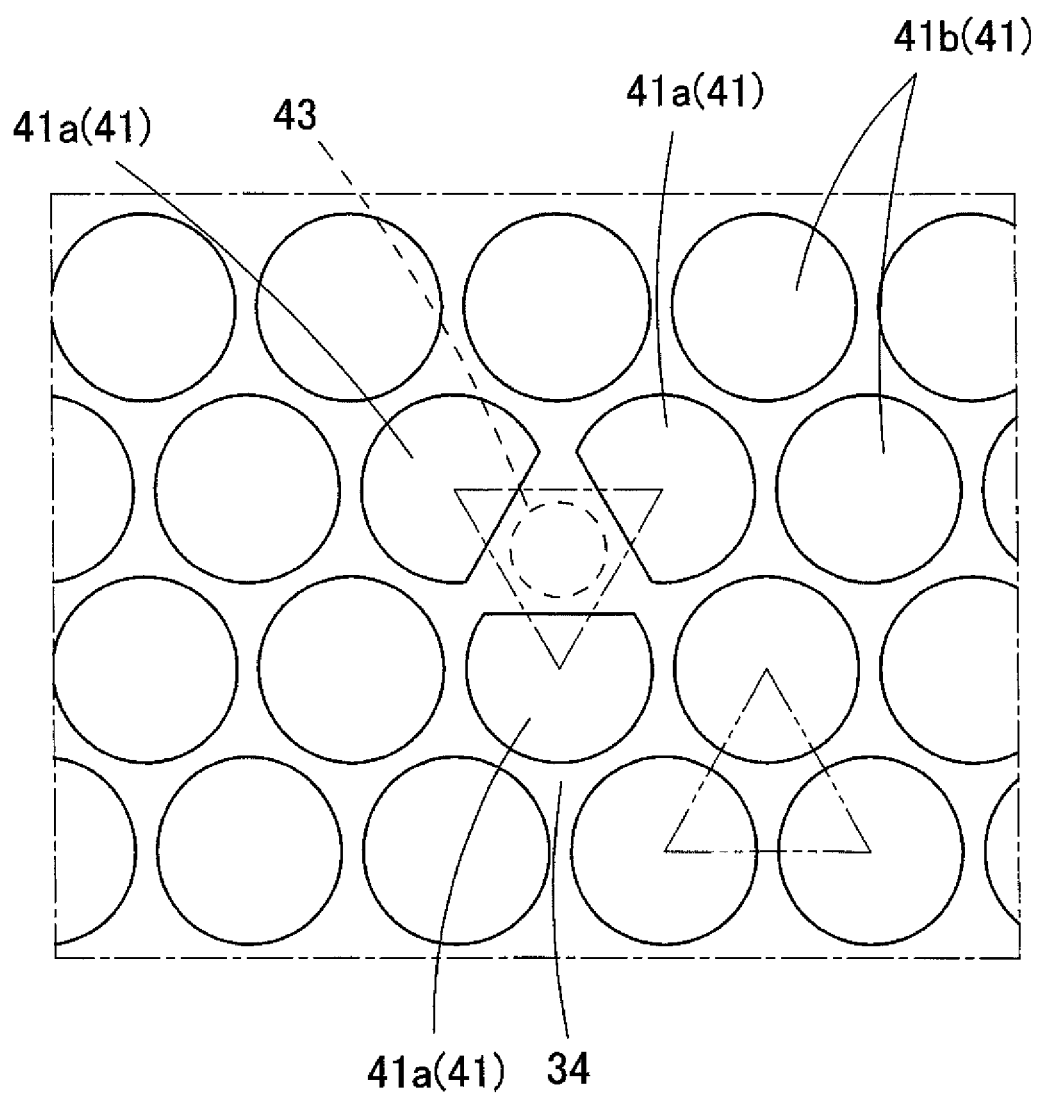
FIG. 7 is a diagram showing an arrangement of acoustic holes according to Embodiment 2 of the present invention.

FIG. 7 is an enlarged view of a portion of the back plate 34 in an acoustic sensor according to Embodiment 2 of the present invention. In Embodiment 2, the acoustic holes 41 (41a and 41b) are in a regular arrangement. The acoustic holes 41a adjacent to a stopper 43 have a smaller opening area than the other acoustic holes 41b due to the portions of the edges that are in the vicinity of the stopper 43 being drawn inward. Accordingly, the acoustic holes 41a and the other acoustic holes 41b do not have the same shape and do not have similar shapes.

Among the acoustic holes 41 of the Embodiment 2, the edges of the acoustic holes 41a surrounding a stopper 43 recede so as to be farther from the stopper 43, and therefore the area of the region surrounded by the acoustic holes 41a in the location where the stopper 43 is provided is larger. This enables providing stoppers 43 having a large cross-sectional area, and the diaphragm 33 is less likely to be damaged by the tips of the stoppers 43 in the case of drop impact or the like. Moreover, in Embodiment 2 as well, the number of acoustic holes is not reduced, and the opening area of only the acoustic holes 41a that surround a stopper 43 is smaller, and therefore compared to the case where the opening area of all of the acoustic holes is reduced to accommodate stoppers 43 having a large cross-sectional area, the total opening area of the acoustic holes 41a and 41b can be increased, and the S/N ratio of the acoustic sensor 31 can be improved. Also, even in comparison with the case where all of the acoustic holes have the same size as the acoustic holes 41b (stoppers 43 having a large cross-sectional area cannot be provided in this case), a decrease in the S/N ratio can be suppressed to a minimum. Accordingly, in the case of Embodiment 2 as well, it is possible to improve the S/N ratio and also improve the durability of the diaphragm.

Also, the acoustic holes of Embodiment 2 also have the feature described in Embodiment 1. Specifically, among the repeating smallest units indicated by dashed double-dotted lines in FIG. 7, the total area of the acoustic holes 41a included in a repeating smallest unit having a stopper 43 is smaller than the total area of the acoustic holes 41b included in a repeating smallest unit not having a stopper 43.

Also, with the acoustic holes of Embodiment 2 as well, the shortest distance D (shown in FIG. 8A) from the cross-sectional center P of a stopper 43 to the edge of an acoustic hole 41a adjacent to the stopper 43 is longer than the shortest distance d (shown in FIG. 8B) from the center Q of the region that is surrounded by acoustic holes but is not provided with the stopper 43 to the edge of an acoustic hole 41b in the periphery.

Figure 8A:
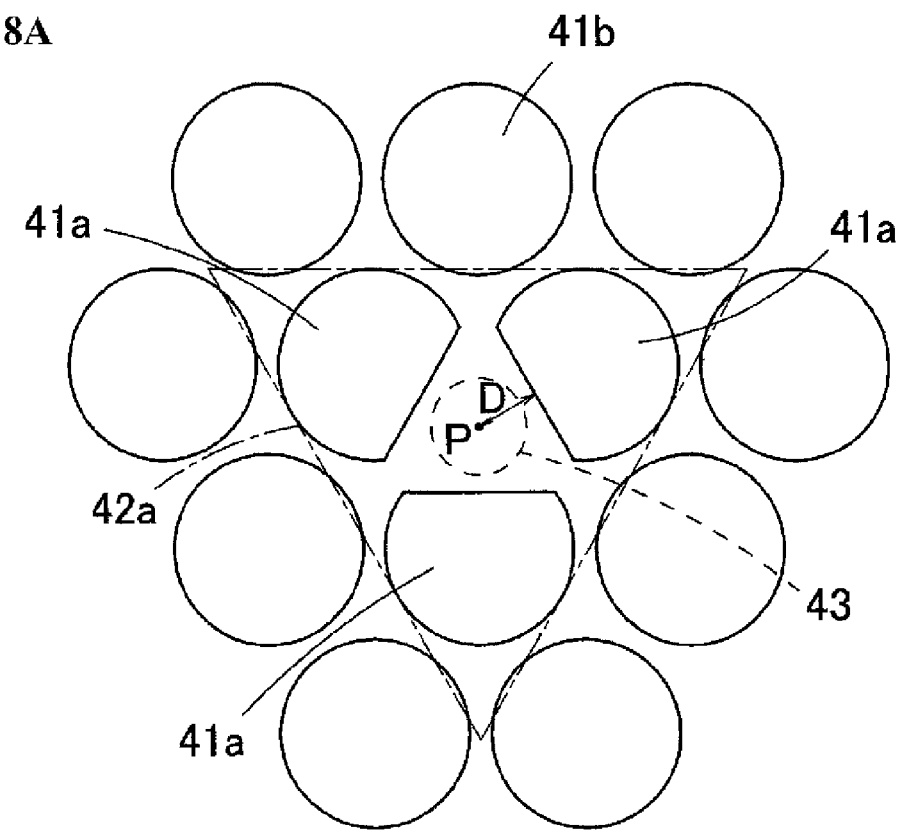
FIGS. 8A and 8B are diagrams for describing features of the arrangement of acoustic holes according to Embodiment 2 of the present invention.
Figure 8B:
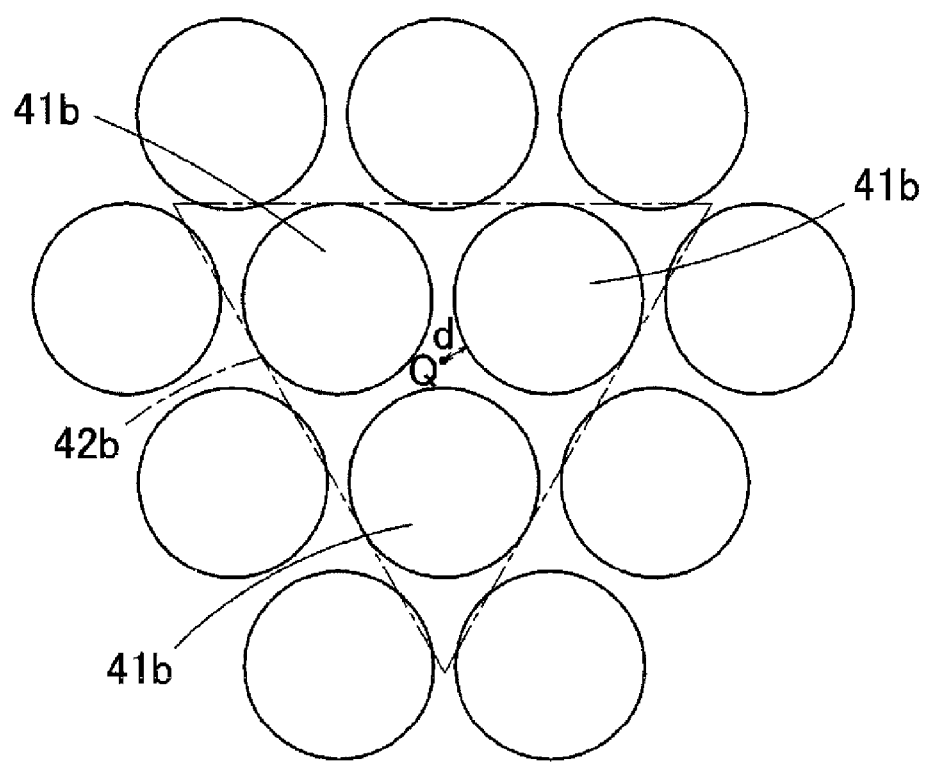

Also, with the acoustic holes of Embodiment 2 as well, the number of acoustic holes 41a in the frame 42a that encloses the acoustic holes 41a adjacent to a stopper 43 as shown in FIG. 8A is the same as the number of acoustic holes 41b in the frame 42b that encloses the acoustic holes 41b adjacent to the point Q in a region where a stopper 43 is not provided as shown in FIG. 8B.

Embodiment 3

Figure 9:
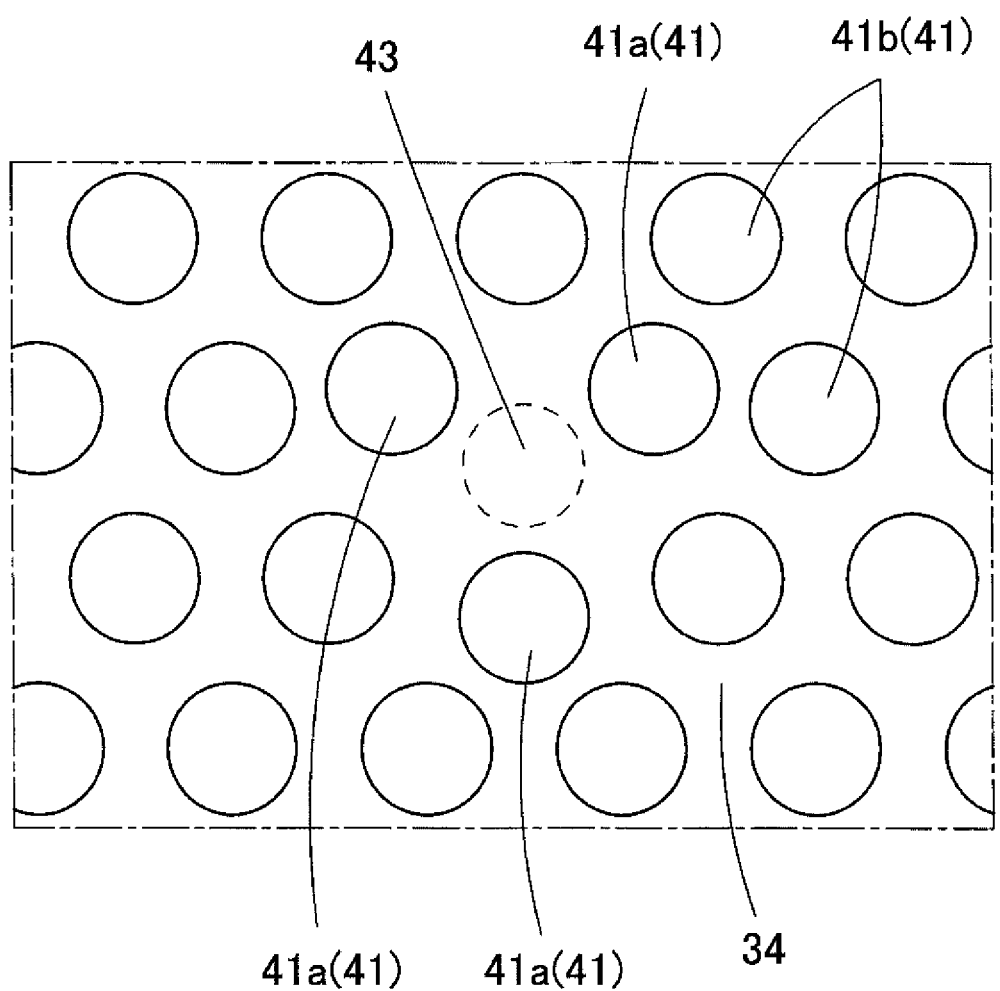
FIG. 9 is a diagram showing an arrangement of acoustic holes according to Embodiment 3 of the present invention.

FIG. 9 is an enlarged view of a portion of the back plate 34 in an acoustic sensor according to Embodiment 3 of the present invention. In Embodiment 3, the space between acoustic holes 41a adjacent to a stopper 43 is larger than the space between acoustic holes 41b not adjacent to a stopper 43. Specifically, in Embodiment 3, the acoustic holes 41b other than the acoustic holes 41a adjacent to a stopper 43 are in a regular arrangement having a constant pitch. On the other hand, the positions of the acoustic holes 41a adjacent to a stopper 43 are shifted in the direction of separation from the stopper 43 relative to the regularly-placed positions of the acoustic holes 41b.

Among the acoustic holes 41 of the Embodiment 3, the acoustic holes 41a surrounding a stopper 43 are shifted in the direction of separation from the stopper 43, and therefore the area of the region surrounded by the acoustic holes 41a in the location where the stopper 43 is provided is larger. This enables providing stoppers 43 having a large cross-sectional area, and the diaphragm 33 is less likely to be damaged by the tips of the stoppers 43 in the case of drop impact or the like. Moreover, in Embodiment 3 as well, the number of acoustic holes is not reduced, and the opening area of only the acoustic holes 41a that surround a stopper 43 is smaller, and therefore compared to the case where the opening area of all of the acoustic holes is reduced to accommodate stoppers 43 having a large cross-sectional area, the total opening area of the acoustic holes 41a and 41b can be increased, and the S/N ratio of the acoustic sensor 31 can be improved. Also, even in comparison with the case where all of the acoustic holes have the same size as the acoustic holes 41b (stoppers 43 having a large cross-sectional area cannot be provided in this case), a decrease in the S/N ratio can be suppressed to a minimum. Accordingly, in the case of Embodiment 3 as well, it is possible to improve the S/N ratio and also improve the durability of the diaphragm.

Also, the acoustic holes of Embodiment 3 also have the feature described in Embodiment 1. Specifically, the shortest distance D (shown in FIG. 10A) from the cross-sectional center P of a stopper 43 to the edge of an acoustic hole 41a adjacent to the stopper 43 is longer than the shortest distance d (shown in FIG. 10B) from the center Q of the region that is surrounded by acoustic holes but is not provided with the stopper 43 to the edge of an acoustic hole 41b in the periphery.

Figure 10A:
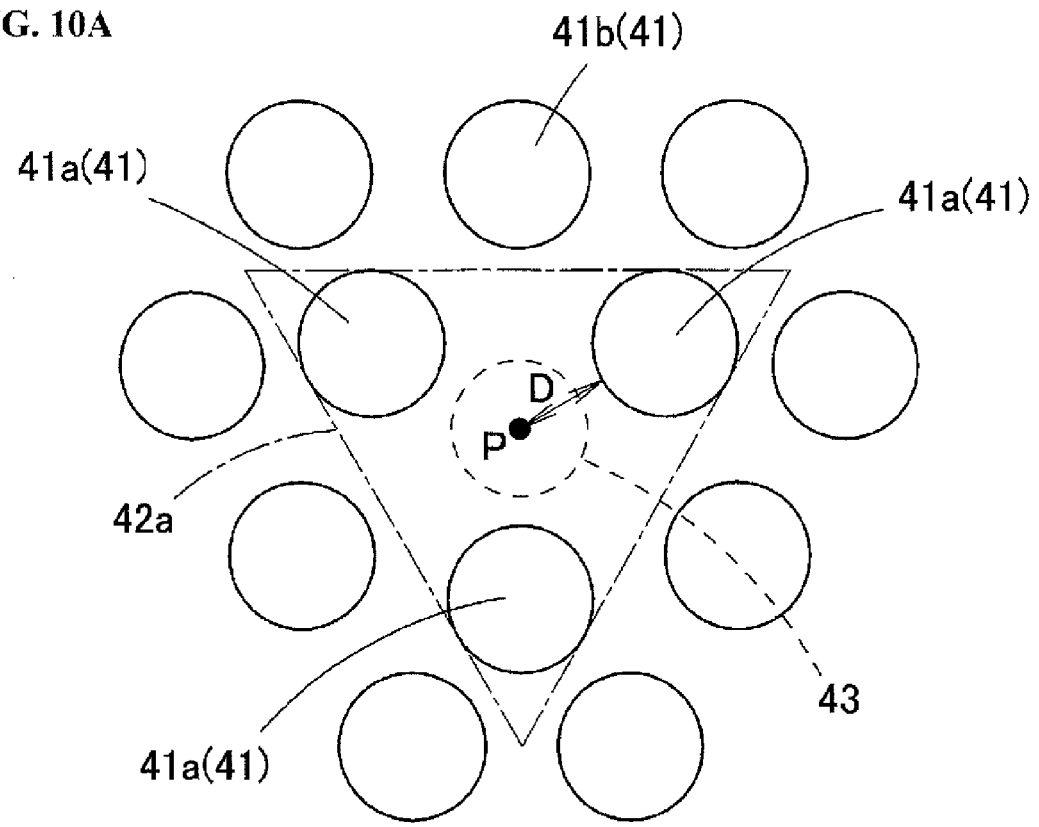
FIGS. 10A and 10B are diagrams for describing features of the arrangement of acoustic holes according to Embodiment 3 of the present invention.
Figure 10B:
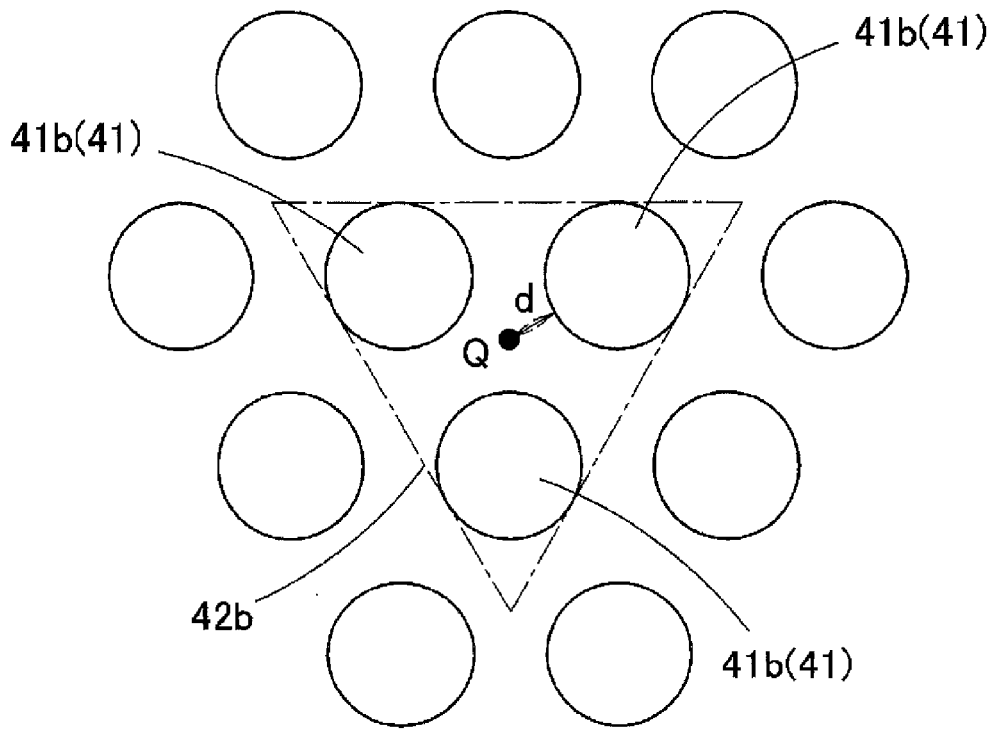

Also, with the acoustic holes of Embodiment 3 as well, the number of acoustic holes 41a in the frame 42a that encloses the acoustic holes 41a adjacent to a stopper 43 as shown in FIG. 10A is the same as the number of acoustic holes 41b in the frame 42b that encloses the acoustic holes 41b adjacent to the point Q in a region that is surrounded by acoustic holes but is not provided with a stopper 43 as shown in FIG. 10B.

When Embodiments 1 to 3 are compared, the method of shifting the acoustic holes 41a adjacent to a stopper 43 as in Embodiment 3 makes it possible to increase the cross-sectional area of the stoppers 43 without reducing the opening area of the acoustic holes 41a. However, if the opening area of the acoustic holes 41a and 41b is maximized, there is no leeway for shifting the acoustic holes 41a, and therefore Embodiment 3 cannot be applied in such a case. Embodiments 1 and 2 can be applied even if the opening area of the acoustic holes 41b is maximized. However, in Embodiments 1 and 2, the opening area of the acoustic holes 41a is smaller than the opening area of the acoustic holes 41b, but the overall opening area of the acoustic holes can be increased by maximizing the opening area of the acoustic holes 41b, thus obtaining a favorable S/N ratio.

Figure 11A:
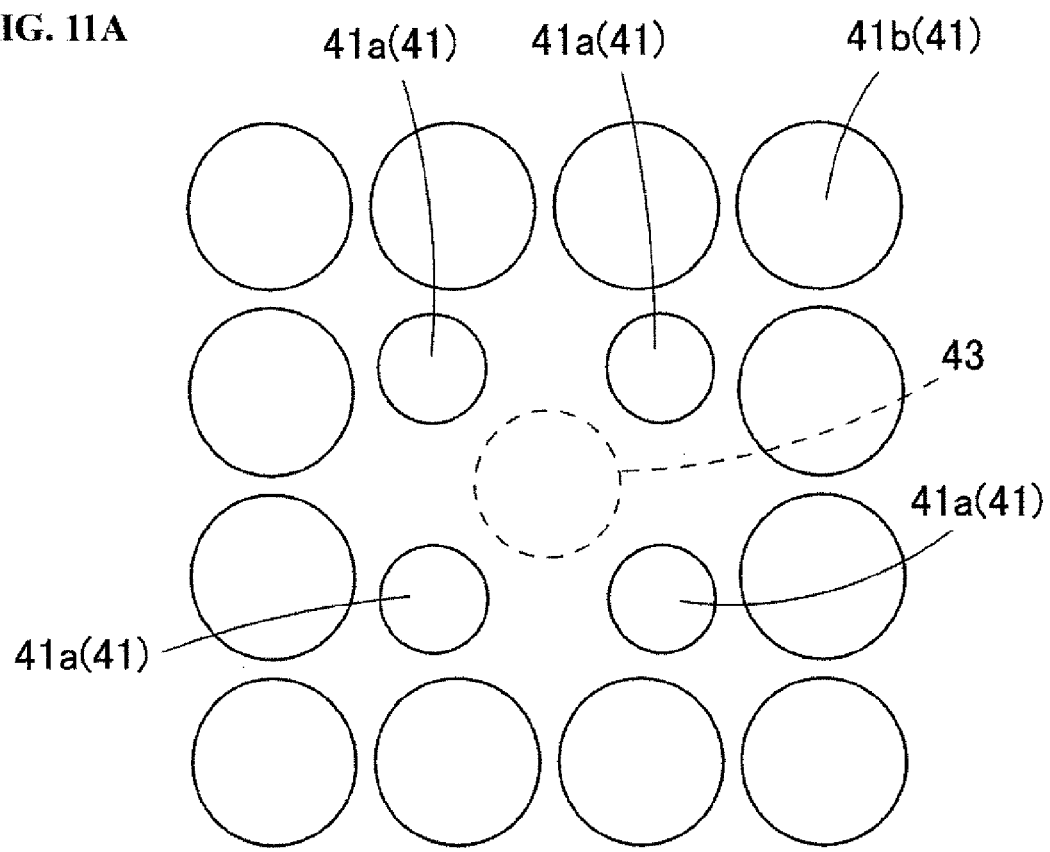
FIGS. 11A and 11B are diagrams showing arrangements of acoustic holes according to variations of the present invention.
Figure 11B:
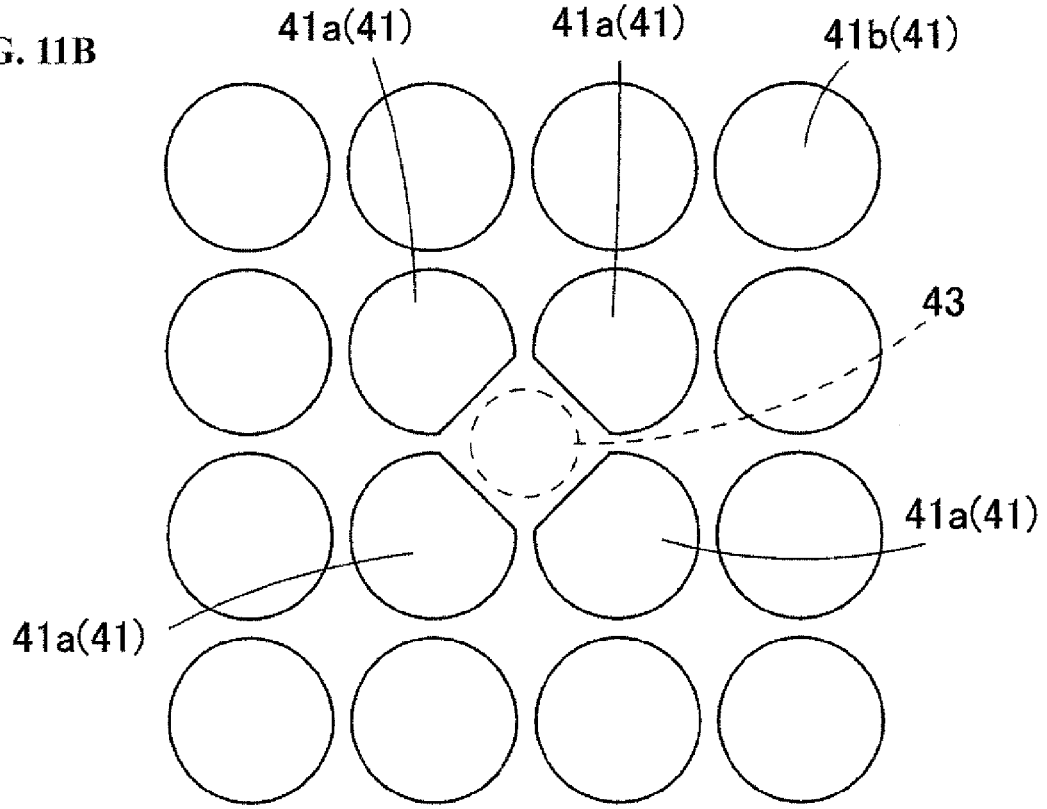

Variations of Embodiments 1 to 3 Although the acoustic holes 41 are arranged in a triangular shape in Embodiment 3, the arrangement of the acoustic holes 41 is not limited to being a triangular arrangement. In FIGS. 11A and 11B, basically circular acoustic holes 41 are arranged in a rectangular shape. In particular, in the variation in FIG. 11A, the acoustic holes 41 are arranged in a rectangular shape, and moreover, the opening area of the acoustic holes 41a surrounding a stopper 43 is set smaller than the opening area of the other acoustic holes 41b, and furthermore the acoustic holes 41a surrounding the stopper 43 are shifted in the direction of separation from the stopper 43. In this way, a combination of Embodiments 1 to 3 makes it possible to optimize the dimensions of the acoustic holes 41 and the stoppers 43, increase the opening area of the acoustic holes 41, and provide stoppers 43 having a larger cross-sectional area.

Also, in the variation in FIG. 11B, the acoustic holes 41 are arranged in a rectangular shape, and the edges of the acoustic holes 41a surrounding a stopper 43 recede so as to be farther from the stopper 43 so as to reduce the area of the acoustic holes 41a. Accordingly, it may be possible to have a combination with a method of similarly reducing the size of the acoustic holes 41a and shifting them in the direction of separation from the stopper 43.

Figure 12A:
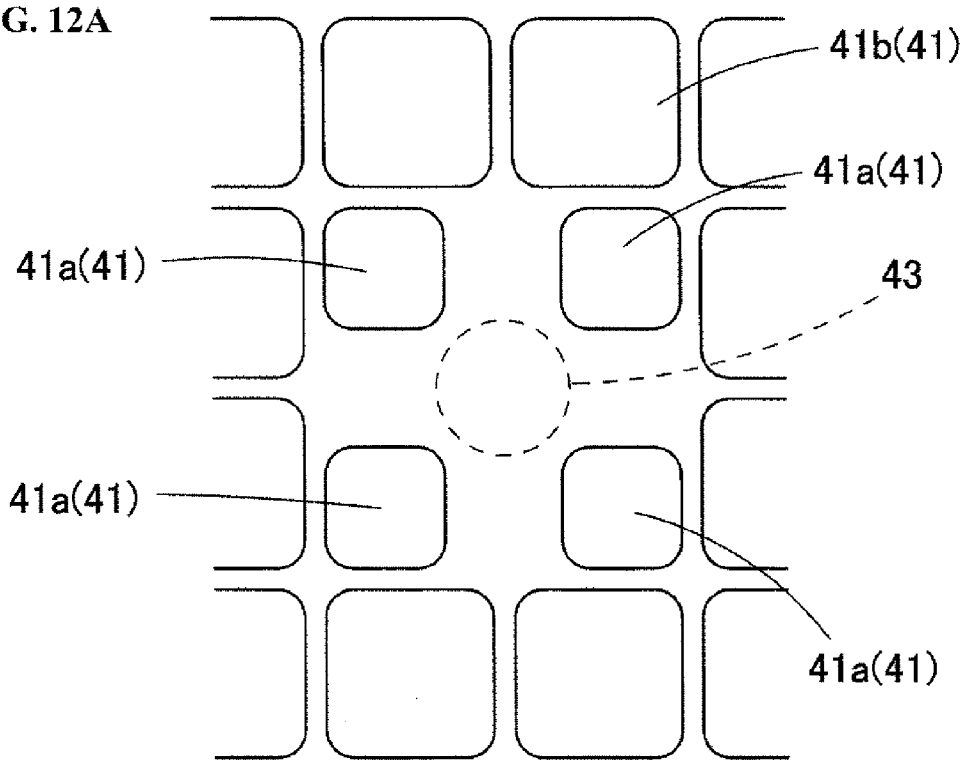
FIGS. 12A and 12B are diagrams showing arrangements of acoustic holes according to other variations of the present invention.
Figure 12B:
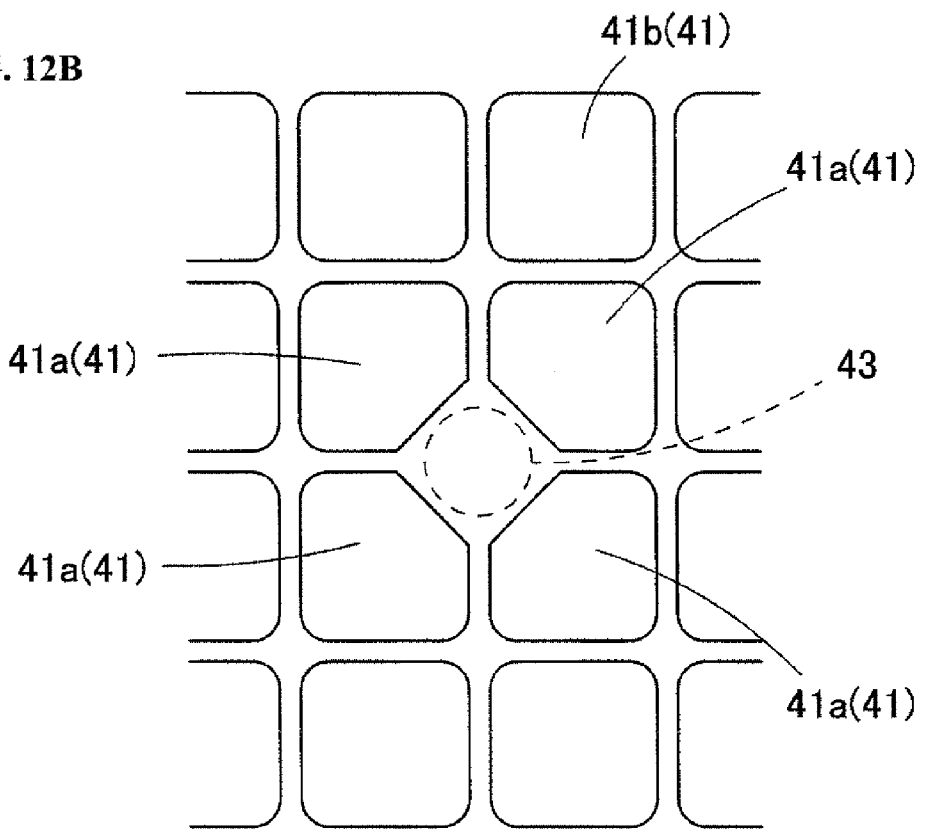

FIGS. 12A and 12B show variations in which the acoustic holes 41 are rectangular. In FIG. 12A, the opening area of the acoustic holes 41a surrounding a stopper 43 is set smaller than the opening area of the other acoustic holes 41b, and the acoustic holes 41a are shifted in the direction of separation from the stopper 43. In FIG. 12B, the edges of the acoustic holes 41a surrounding a stopper 43 recede in the direction of separation from the stopper 43 so as to reduce the area of the acoustic holes 41a. Note that the corners of the acoustic holes 41 are rounded to alleviate the concentration of stress.

Figure 13A:
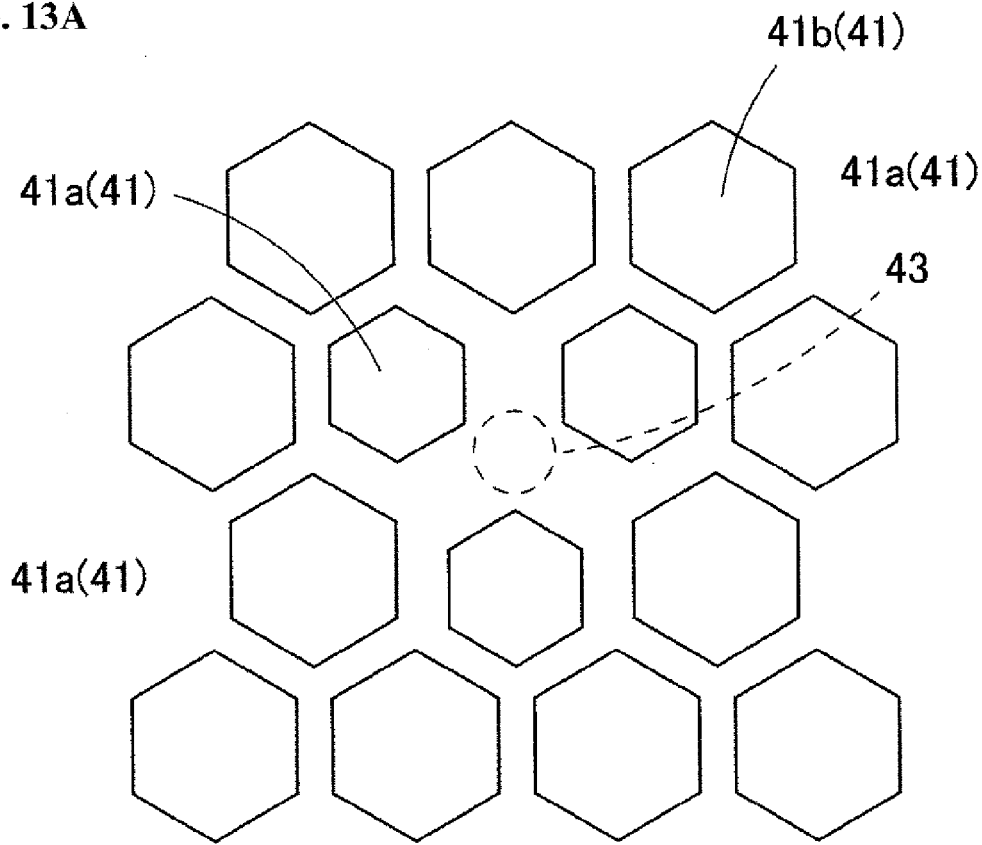
FIGS. 13A and 13B are diagrams showing arrangements of acoustic holes according to yet other variations of the present invention.
Figure 13B:
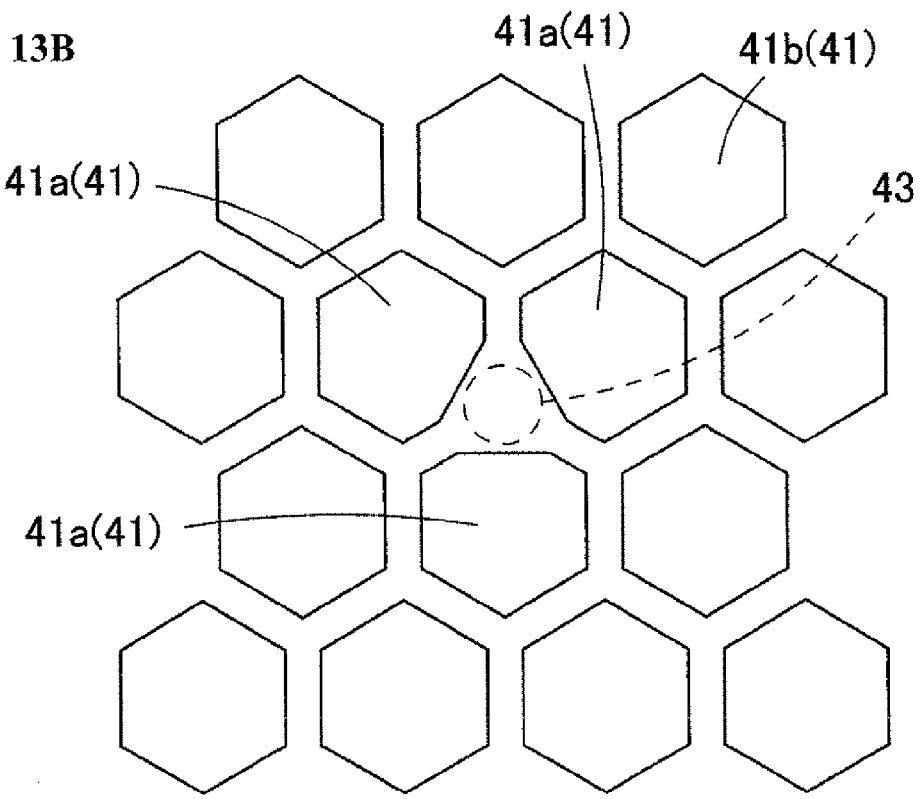

FIGS. 13A and 13B show variations in which the acoustic holes 41 are hexagonal and arranged in a honeycomb manner. In FIG. 13A, the opening area of the acoustic holes 41a surrounding a stopper 43 is set smaller than the opening area of the other acoustic holes 41b, and the acoustic holes 41a are shifted in the direction of separation from the stopper 43. In FIG. 13B, the edges of the acoustic holes 41a surrounding a stopper 43 recede in the direction of separation from the stopper 43 so as to reduce the area of the acoustic holes 41a.

Figure 14:
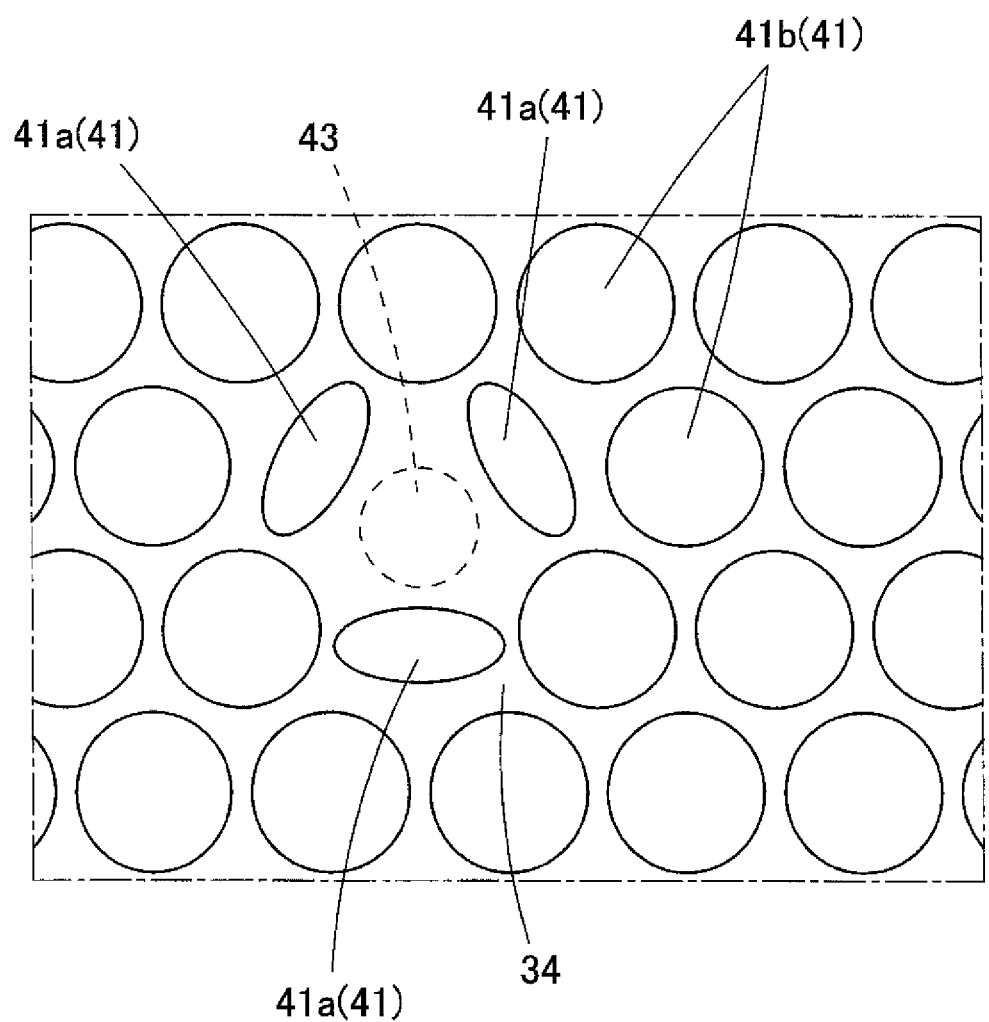
FIG. 14 is a diagram showing an arrangement of acoustic holes according to still another variation of the present invention.

In FIG. 14, the acoustic holes 41a surrounding a stopper 43 have a flattened shape, such as an ellipse. The acoustic holes 41a are each arranged such that its minor axis direction is parallel to the direction connecting the cross-sectional center of the stopper 43 and the center of the acoustic hole 41a. In this variation, the area of the region for providing the stopper 43 can be increased without reducing the opening area of the acoustic holes 41a very much and, according to one or more embodiments of the present invention, while keeping the same opening area as the acoustic holes 41b.

Figure 15:
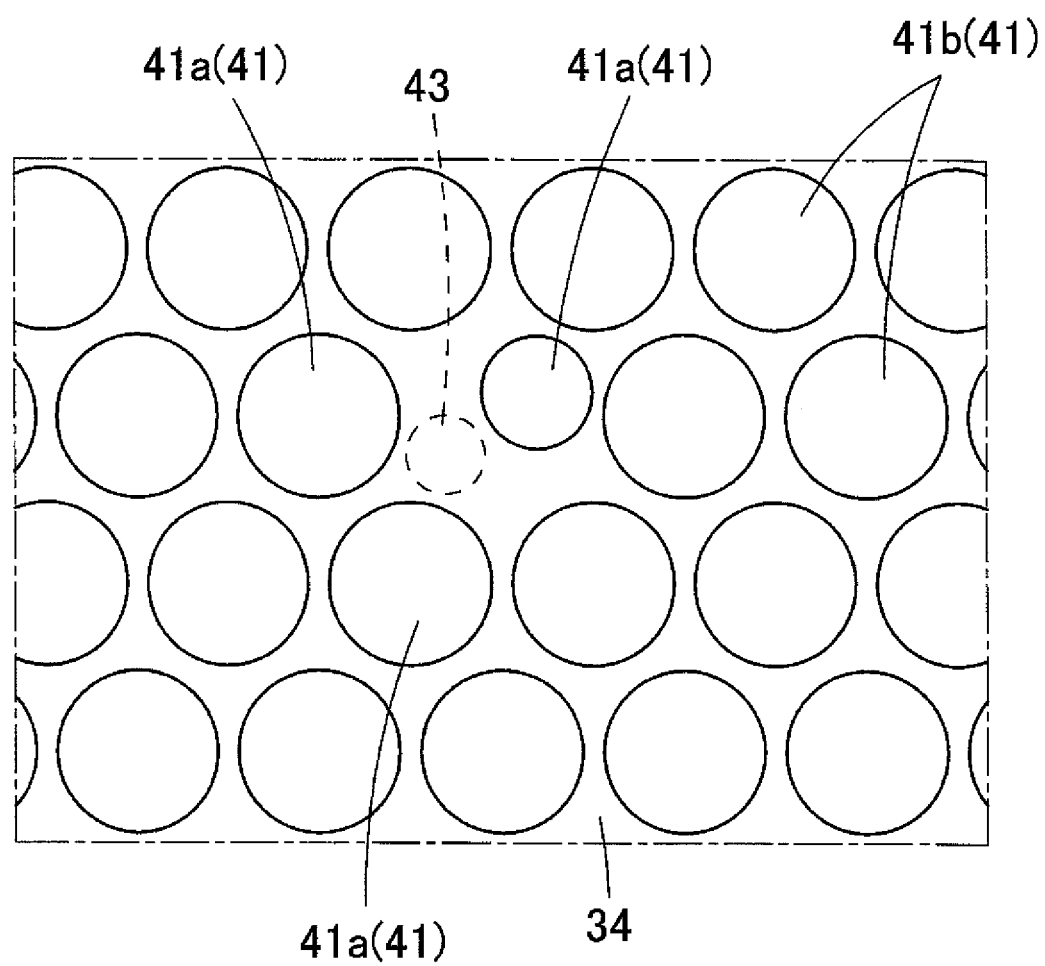
FIG. 15 is a diagram showing an arrangement of acoustic holes according to still another variation of the present invention.

FIG. 15 shows a variation in which the method of any of Embodiments 1 to 3 is applied to only a portion of acoustic holes 41a among the multiple acoustic holes 41a that surround a stopper 43. In FIG. 15, the opening area of only one acoustic hole 41a has been reduced. In this variation, it is possible to increase the cross-sectional area of the stopper 43 while reducing the decrease in the total opening area of the acoustic holes 41.

Points to Consider in Design

Figure 16A:
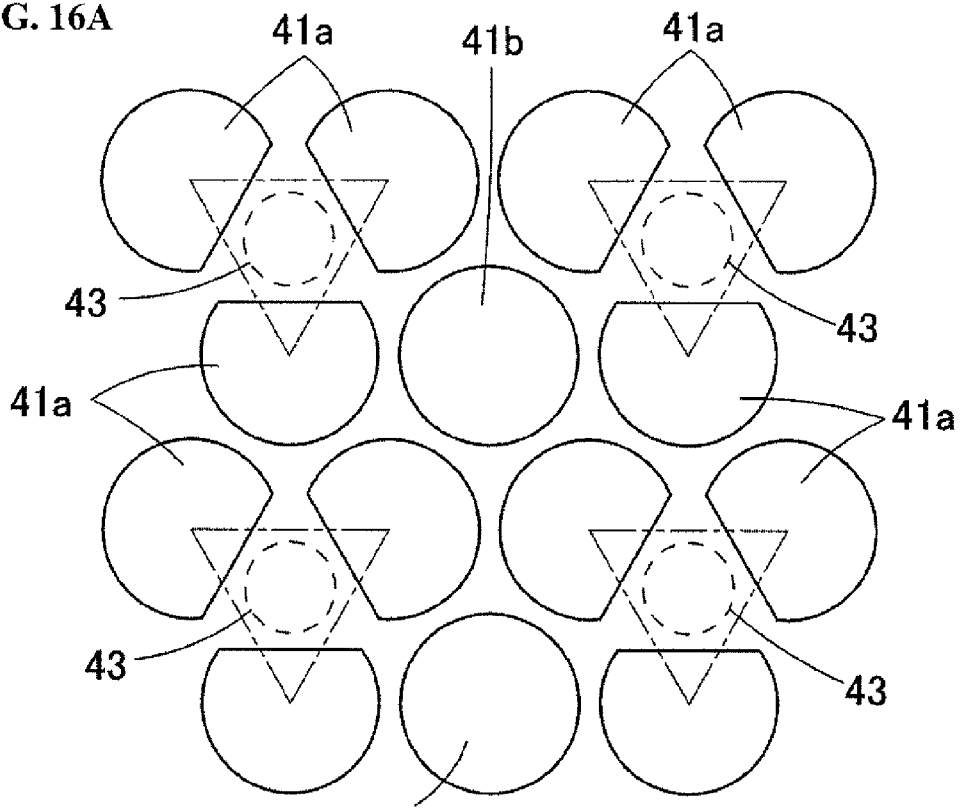
FIGS. 16A and 16B are diagrams for describing a point to consider in design.
Figure 16B:
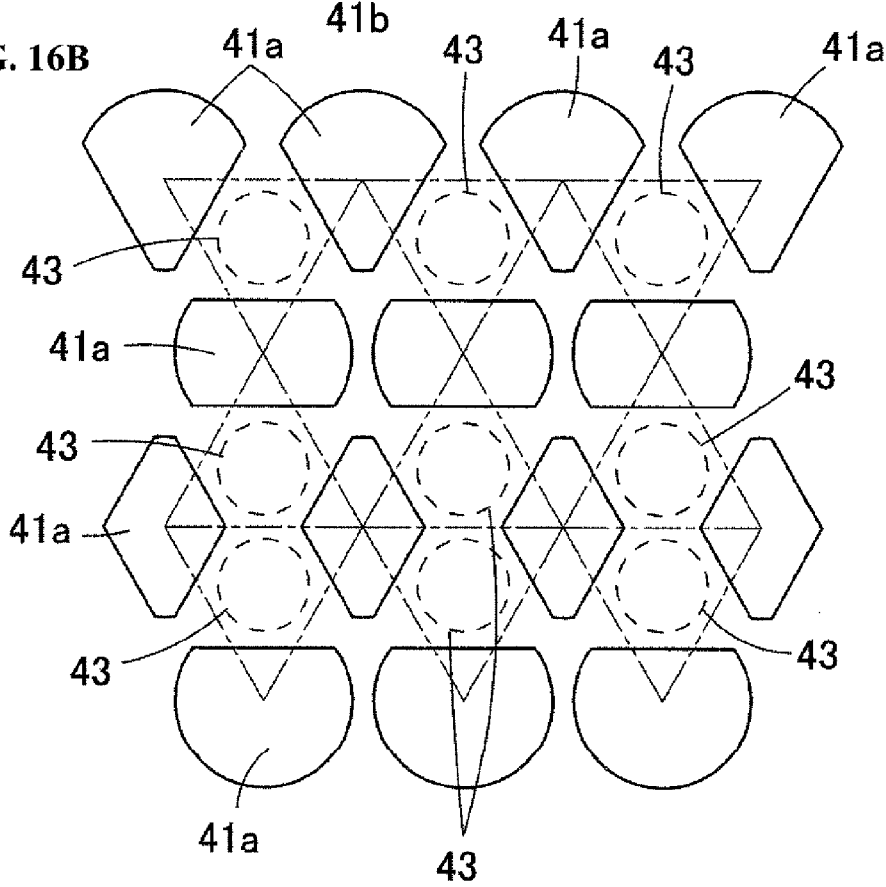

First, the arrangement of the stoppers 43 is not to be made too dense. In particular, it is desirable that the stoppers 43 are arranged such that, as shown in FIG. 16A, repeating smallest units including a stopper 43 are arranged adjacent to each other, and there is no overlap between the acoustic holes 41a adjacent to one stopper 43 and the acoustic holes 41a adjacent to another stopper 43. This is because in the case of Embodiment 2, if repeating smallest units including a stopper 43 are adjacent to each other, all of the acoustic holes are given a reduced opening area, and the total opening area of the acoustic holes is also reduced as shown in FIG. 16B. This is also because in the case of Embodiment 1, if repeating smallest units including a stopper 43 are adjacent to each other, the opening area of the majority of the acoustic holes is reduced.

Figure 17A:
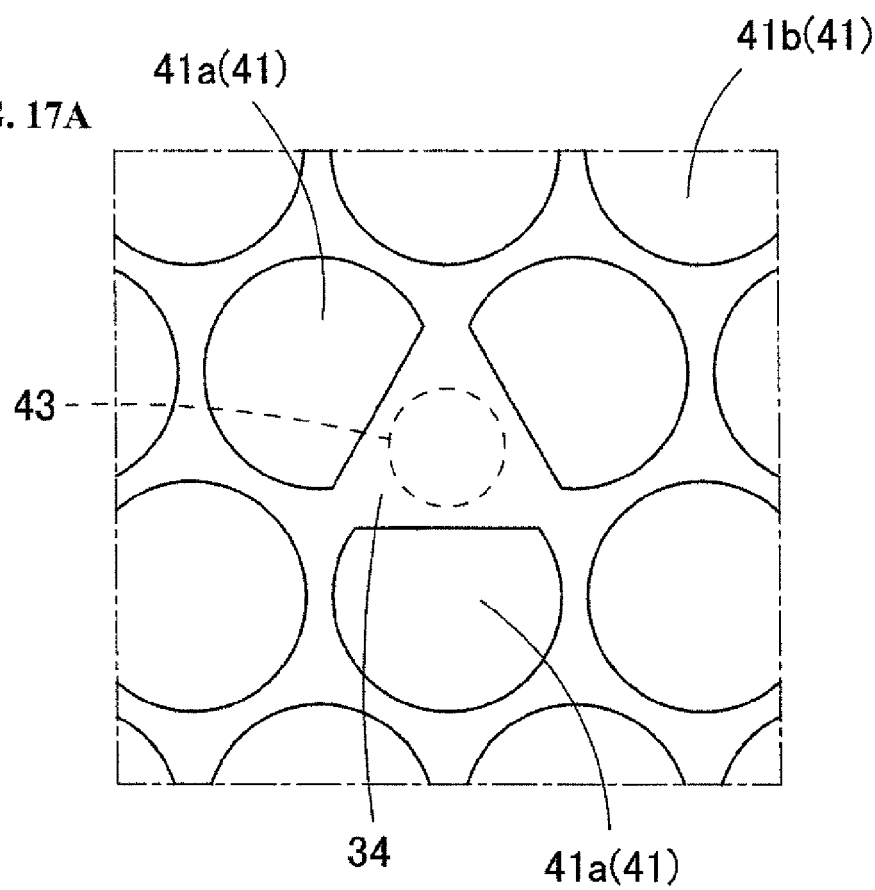
FIGS. 17A and 17B are diagrams for describing another point to consider in design.
Figure 17B:
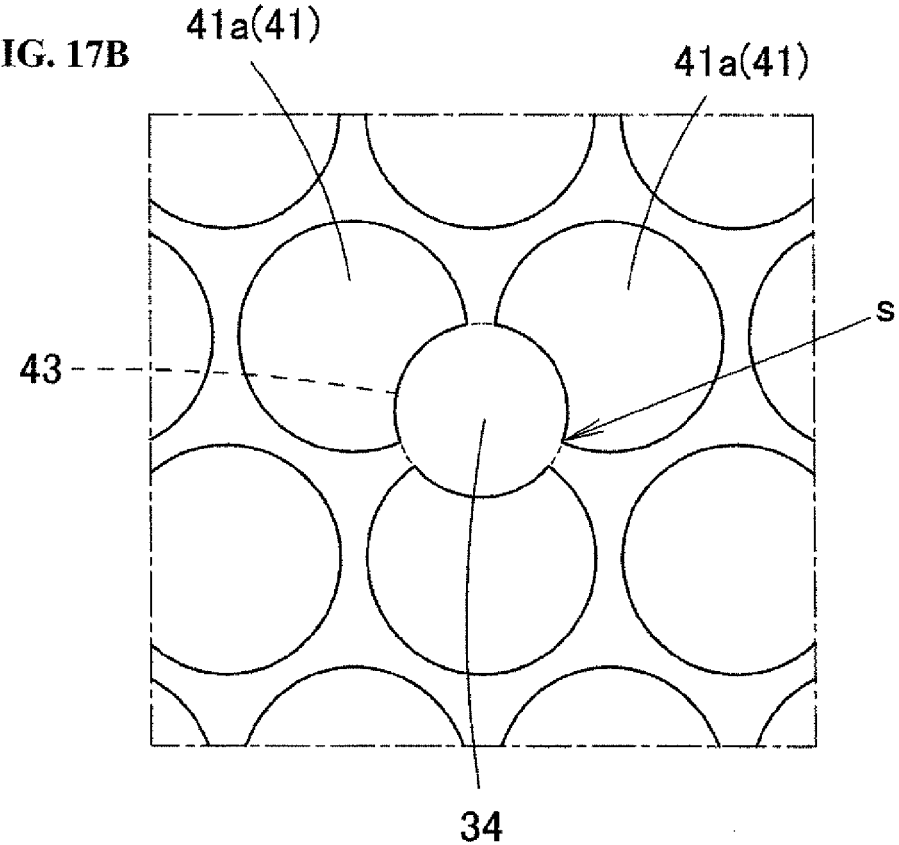

Also, it is desirable that the edges of the acoustic holes 41a adjacent to a stopper 43 and the edge of the stopper 43 are separated from each other. In this case, the area of the region surrounded by the acoustic holes 41a that surround the stopper 43 is larger than the cross-sectional area of the stopper 43, and the stopper 43 fits in the space surrounded by the acoustic holes 41a as shown in FIG. 17A. In contrast, if the cross-sectional area of the stopper 43 is increased, and the edge of the stopper 43 extends into the acoustic holes 41a as shown in FIG. 17B, stress concentrates at ends s of the portions of the edge of the stopper 43 that extend into the acoustic holes 41a, and the strength of the back plate 34 decreases. If the edges of the acoustic holes 41a adjacent to the stopper 43 and the edge of the stopper 43 are separated from each other, it is possible to prevent this decrease in the strength of the back plate 34.

Also, it is desirable that the fixed electrode plate 40 is not discontinuous in the periphery of a stopper 43. Specifically, if acoustic holes 41a and a stopper 43 are provided in the back plate 34 as shown in FIG. 18A, it is desirable that the fixed electrode plate 40 is provided in the entirety of the region excluding the region of the acoustic holes 41 and the stopper 43 as shown in FIG. 18B. This is because if the fixed electrode plate 40 is discontinuous in the periphery of the stopper 43 as shown in FIG. 18C, stress easily becomes concentrated at the ends c of the discontinuous portions, and the fixed electrode plate 40 and the back plate 34 are more likely to become damaged when the acoustic sensor is dropped.

Embodiment 4

Figure 19:
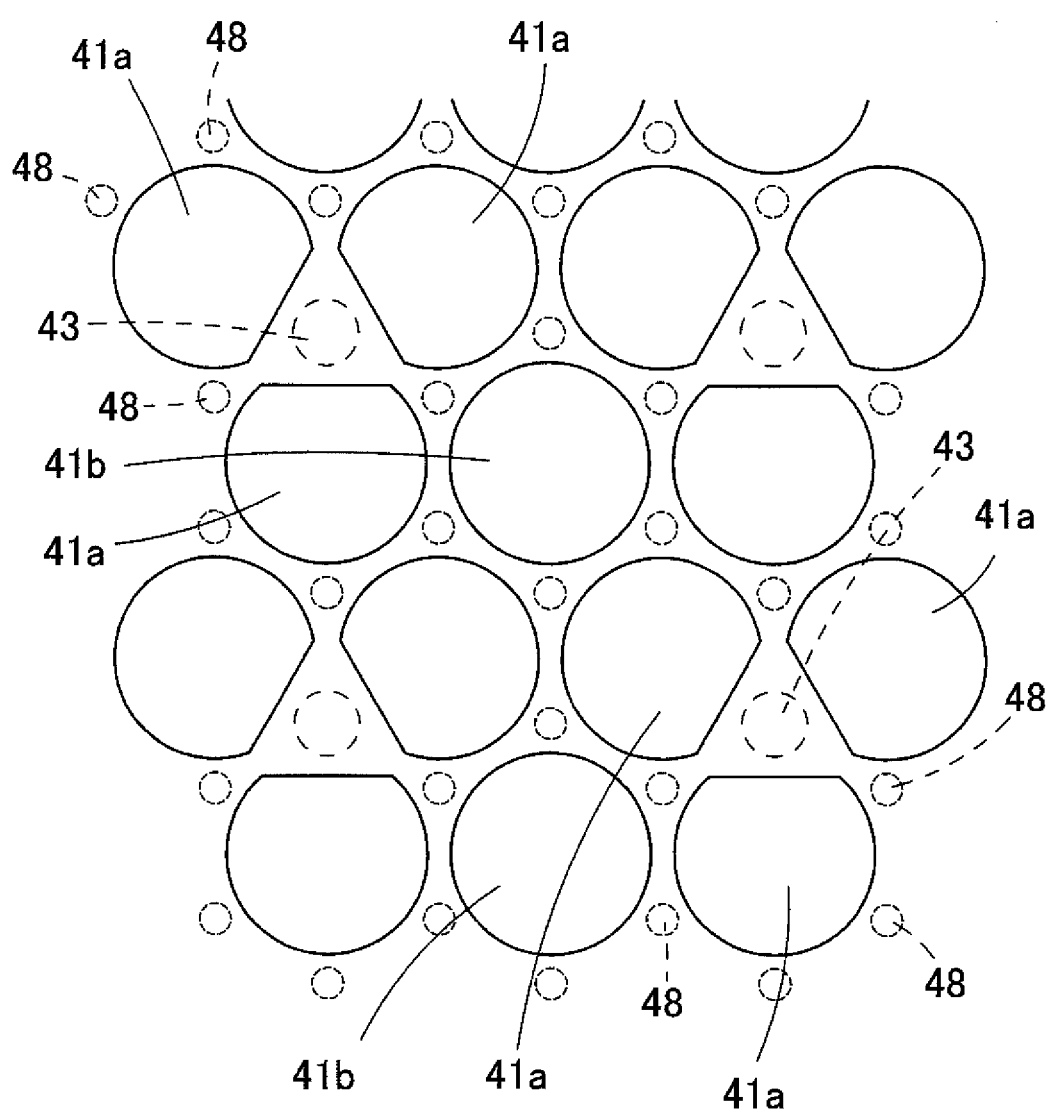
FIG. 19 is a diagram showing an arrangement of acoustic holes according to Embodiment 4 of the present invention.

FIG. 19 is a diagram showing an arrangement of stoppers in Embodiment 4 of the present invention. In Embodiment 4, stoppers 43 and 48 are provided in regions surrounded by acoustic holes 41, and modifications as in any of Embodiments 1 to 3 are applied to only the acoustic holes 41a surrounding the stoppers 43. For example, the edges of only the acoustic holes 41a that surround the stoppers 43 recede inward, and the cross-sectional area of the stoppers 43 is larger than the cross-sectional area of the other stoppers 48. Since the number of stoppers can be increased in Embodiment 4, there is no risk of a portion of the diaphragm 33 becoming embedded between stoppers and affixed to the fixed electrode plate 40. Also, since the cross-sectional area of the stoppers 43 is larger, the diaphragm 33 is not likely to become damaged even if the diaphragm 33 collides with the stoppers 43 and 48. Moreover, since the opening area of the acoustic holes 41 can be increased, the S/N ratio of the acoustic sensor can also be improved.

Embodiment 5

Figure 20:
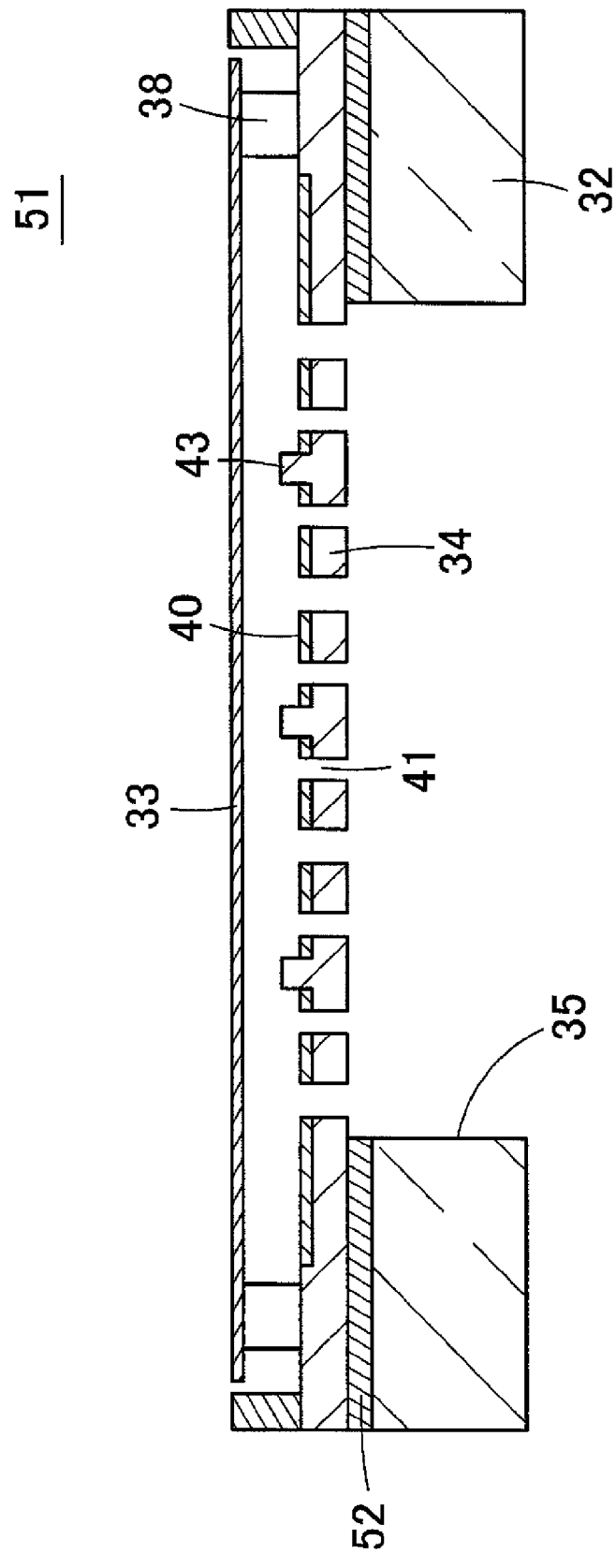
FIG. 20 is a cross-sectional diagram of an acoustic sensor according to Embodiment 5 of the present invention.

FIG. 20 is a cross-sectional diagram of an acoustic sensor 51 according to Embodiment 5 of the present invention, a feature of which is that the diaphragm 33 is provided above the fixed electrode plate 40. In the acoustic sensor 51, a flat plate-shaped back plate 34 is provided on the upper surface of the substrate 32 via an insulation layer 52. The fixed electrode plate 40 is formed on the upper surface of the back plate 34. Multiple acoustic holes 41 are formed in the back plate 34 and the fixed electrode plate 40 above the cavity 35. Also, stoppers 43 protrude from the upper surface of the back plate 34. In Embodiment 5 as well, the acoustic holes 41 have a shape and arrangement similar to those of any of the above embodiments. The diaphragm 33 is arranged so as to oppose the fixed electrode plate 40 above the back plate 34. The diaphragm 33 is supported by anchors 38 provided on the upper surface of the back plate 34.

Application in Microphone

Figure 21:
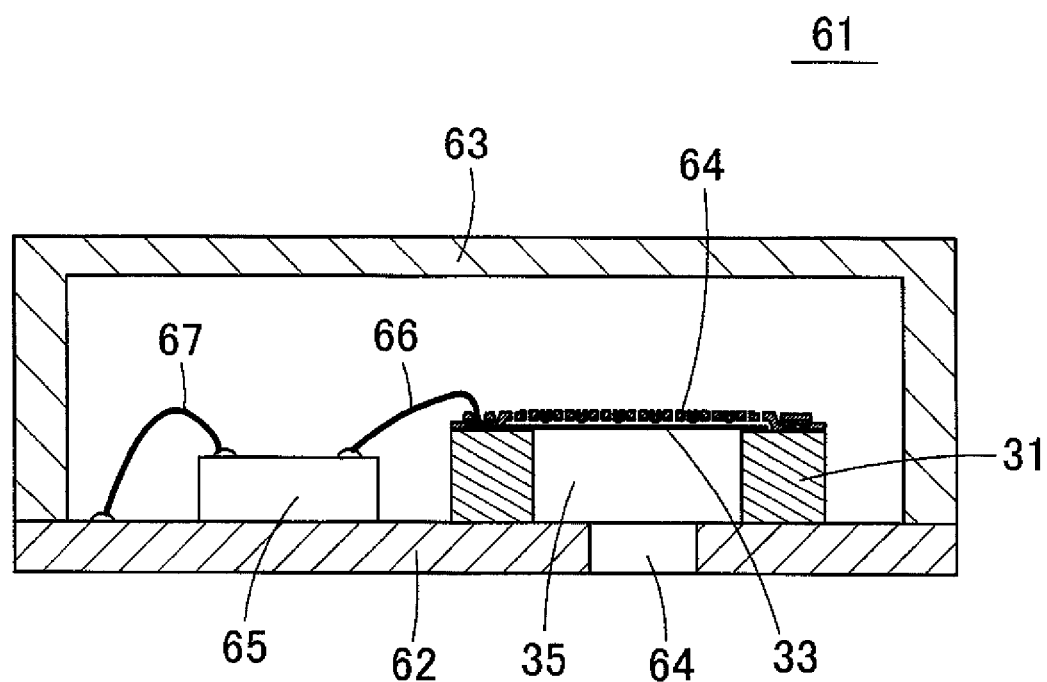

FIG. 21 is a schematic cross-sectional diagram of a bottom port type of microphone 61 including an acoustic sensor according to one or more embodiments of the present invention, such as the acoustic sensor 31 of Embodiment 1. This microphone 61 has the acoustic sensor 31 and a signal processing circuit 65 (ASIC), which is a circuit portion, built into a package made up of a circuit substrate 62 and a cover 63. The acoustic sensor 31 and the signal processing circuit 65 are mounted on the upper surface of the circuit substrate 62. A sound introduction hole 64 for the introduction of acoustic vibration into the acoustic sensor 31 is formed in the circuit substrate 62. The acoustic sensor 31 is mounted on the upper surface of the circuit substrate 62 such that the lower opening of the cavity 35 is aligned with the sound introduction hole 64 and covers the sound introduction hole 64. Accordingly, the cavity 35 of the acoustic sensor 31 is the front chamber, and the space inside the package is the back chamber.

The acoustic sensor 31 and the signal processing circuit 65 are connected by a bonding wire 66. Furthermore, the signal processing circuit 65 is connected to the circuit substrate 62 by a bonding wire 67. Note that signal processing circuit 65 has a function of supplying power to the acoustic sensor 31 and a function of outputting a capacitance change signal from the acoustic sensor 31 to the outside.

The cover 63 is attached to the upper surface of the circuit substrate 62 so as to cover the acoustic sensor 31 and the signal processing circuit 65. The package has an electromagnetic shielding function, and protects the acoustic sensor 31 and the signal processing circuit 65 from mechanical shock and electrical disturbances from the outside.

In this way, acoustic vibration that has entered the cavity 35 through the sound introduction hole 64 is detected by the acoustic sensor 31, and then output after being subjected to amplification and signal processing by the signal processing circuit 65. Since the space inside the package is the back chamber in this microphone 61, the area of the back chamber can be increased, and the sensitivity of the microphone 61 can be increased.

Note that in this microphone 61, the sound introduction hole 64 for introducing acoustic vibration into the package may be formed in the upper surface of the cover 63. In this case, the cavity 35 of the acoustic sensor 31 is the back chamber, and the space inside the package is the front chamber.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A capacitance-type transducer comprising:
   a substrate having a cavity;
   a vibrating electrode plate disposed above the substrate;
   a back plate disposed on the substrate;
   a fixed electrode plate disposed on the back plate opposite the vibrating electrode plate;
   a plurality of holes formed in the back plate and the fixed electrode plate; and
   a protrusion disposed on the back plate at a location opposing the vibrating electrode plate,
   wherein in a view from a direction perpendicular to an upper surface of the substrate, a shortest distance from a cross-sectional center of the protrusion to an edge of a hole adjacent to the protrusion is larger than a shortest distance from a center of a region that is surrounded by the holes but not provided with the protrusion to an edge of a hole in the periphery, and
   wherein in an edge of at least one hole among the holes adjacent to the protrusion, a portion of the edge in the vicinity of the protrusion is drawn toward the interior of the hole in comparison with another hole.

2. The capacitance-type transducer according to claim 1, wherein the holes are arranged regularly with a region having a constant area serving as a unit, and
   wherein, among the regions having a constant area, the total area of the holes included in a region that has the protrusion is smaller than the total area of the holes included in a region that does not have the protrusion.

3. The capacitance-type transducer according to claim 1, wherein the number of holes included in a region that encloses the holes adjacent to the protrusion is the same as the number of holes included in a region that encloses the holes adjacent to a center of a region that is surrounded by the holes but not provided with the protrusion.

4. A capacitance-type transducer comprising:
   a substrate having a cavity;
   a vibrating electrode plate disposed above the substrate;
   a back plate disposed on the substrate;
   a fixed electrode plate disposed on the back plate opposite the vibrating electrode plate;
   a plurality of holes formed in the back plate and the fixed electrode plate; and
   a protrusion disposed on the back plate at a location opposing the vibrating electrode plate,
   wherein the area of at least one hole among the holes adjacent to the protrusion is smaller than the area of a hole not adjacent to the protrusion, and
   wherein in an edge of at least one hole among the holes adjacent to the protrusion, a portion of the edge in the vicinity of the protrusion is drawn toward the interior of the hole in comparison with another hole.

5. The capacitance-type transducer according to claim 4, wherein the holes adjacent to the protrusion and the other holes have similar shapes.

6. A capacitance-type transducer comprising:
   a substrate having a cavity;
   a vibrating electrode plate disposed above the substrate;
   a back plate disposed on the substrate;
   a fixed electrode plate disposed on the back plate opposite the vibrating electrode plate;
   a plurality of holes formed in the back plate and the fixed electrode plate; and
   a protrusion disposed on the back plate at a location opposing the vibrating electrode plate,
   wherein in an edge of at least one hole among the holes adjacent to the protrusion, a portion of the edge in the vicinity of the protrusion is drawn toward the interior of the hole in comparison with another hole.

7. The capacitance-type transducer according to claim 6, wherein the holes other than the holes adjacent to the protrusion have shapes that are the same as or similar to each other, and
   the at least one hole among the holes adjacent to the protrusion and the other holes do not have the same shape, and do not have similar shapes.

8. A capacitance-type transducer comprising:
   a substrate having a cavity;
   a vibrating electrode plate disposed above the substrate;
   a back plate disposed on the substrate;
   a fixed electrode plate disposed on the back plate opposite the vibrating electrode plate;

a plurality of holes formed in the back plate and the fixed electrode plate; and a protrusion disposed on the back plate at a location opposing the vibrating electrode plate, wherein a space between holes adjacent to the protrusion is larger than a space between holes not adjacent to the protrusion, wherein the holes other than the holes adjacent to the protrusion are in a regular arrangement with a constant pitch, and wherein positions of the holes adjacent to the protrusion are shifted in a direction of separation from the protrusion relative to regular positions of the holes.

9. A capacitance-type transducer comprising:

a substrate having a cavity;

a vibrating electrode plate disposed above the substrate;

a back plate disposed on the substrate;

a fixed electrode plate disposed on the back plate opposite the vibrating electrode plate;

a plurality of holes provided in the back plate and the fixed electrode plate; and a protrusion disposed on the back plate at a location opposing the vibrating electrode plate, wherein at least one hole among the holes adjacent to the protrusion has a flattened opening shape, and a minor axis direction of the hole having the flattened opening shape is oriented in a direction connecting a center of the hole and a cross-sectional center of the protrusion.

10. The capacitance-type transducer according to claim 1, wherein edges of the holes adjacent to the protrusion and an edge of the protrusion are separated from each other.

11. The capacitance-type transducer according to claim 1, wherein the area of a region enclosed by the holes adjacent to the protrusion is larger than the cross-sectional area of the protrusion.

12. The capacitance-type transducer according to claim 1, wherein protrusions are arranged such that there is no overlap between the holes adjacent to one protrusion and the holes adjacent to another protrusion.

13. An acoustic sensor employing the capacitance-type transducer according to claim 1, wherein the holes are acoustic holes for allowing passage of acoustic vibration.

14. A microphone comprising:

the acoustic sensor according to claim 13; and a circuit portion that amplifies a signal from the acoustic sensor and outputs the amplified signal to the outside.

* * * * *